United States Patent
Inoue

(10) Patent No.: US 10,978,273 B2
(45) Date of Patent: Apr. 13, 2021

(54) MULTIPLE CHARGED PARTICLE BEAM WRITING METHOD AND APPARATUS USING BEAMS FOR STRADDLING REGIONS

(71) Applicant: NuFlare Technology, Inc., Yokohama (JP)

(72) Inventor: Hideo Inoue, Miura-gun (JP)

(73) Assignee: NuFlare Technology, Inc., Yokohama (JP)

( * ) Notice: Subject to any disclaimer, the term of this patent is extended or adjusted under 35 U.S.C. 154(b) by 193 days.

(21) Appl. No.: 16/228,830

(22) Filed: Dec. 21, 2018

(65) Prior Publication Data
US 2019/0198294 A1 Jun. 27, 2019

(30) Foreign Application Priority Data
Dec. 26, 2017 (JP) .............................. JP2017-249435

(51) Int. Cl.
*H01J 37/317* (2006.01)
*H01J 37/147* (2006.01)
(Continued)

(52) U.S. Cl.
CPC ........ *H01J 37/3177* (2013.01); *H01J 37/045* (2013.01); *H01J 37/1471* (2013.01);
(Continued)

(58) Field of Classification Search
CPC .. H01J 37/3177; H01J 37/1471; H01J 37/045; H01J 37/3026; H01J 2237/31754;
(Continued)

(56) References Cited

U.S. PATENT DOCUMENTS

| 5,260,579 A | 11/1993 | Yasuda et al. |
| 9,691,585 B2 | 6/2017 | Matsumoto et al. |

(Continued)

FOREIGN PATENT DOCUMENTS

| JP | 5-166707 A | 7/1993 |
| JP | 2016-1725 | 1/2016 |

(Continued)

OTHER PUBLICATIONS

Notification of Reason for Refusal dated Jun. 22, 2020 in Korean Patent Application No. 10-2018-0166202 (with unedited computer generated English translation), citing document AO therein, 10 pages.

(Continued)

*Primary Examiner* — Brooke Purinton
(74) *Attorney, Agent, or Firm* — Oblon, McClelland, Maier & Neustadt, L.L.P.

(57) ABSTRACT

A multiple charged particle writing method includes performing a tracking operation by shifting the main deflection position of multiple beams using charged particle beams in the direction of stage movement so that the main deflection position of the multiple beams follows the stage movement while a predetermined number of beam shots of the multiple beams are performed, and shifting the sub deflection position of the multiple beams so that each beam of the multiple beams straddles rectangular regions among plural rectangular regions obtained by dividing a writing region of a target object into meshes by the pitch size between beams of the multiple beams, and the each beam is applied to a different position in each of the rectangular regions straddled, and applying a predetermined number of shots per beam using plural beams in the multiple beams to each of the plural rectangular regions, during the tracking operation.

10 Claims, 14 Drawing Sheets

(51) Int. Cl.
*H01J 37/04* (2006.01)
*H01J 37/302* (2006.01)

(52) U.S. Cl.
CPC ... *H01J 37/3026* (2013.01); *H01J 2237/0435* (2013.01); *H01J 2237/30472* (2013.01); *H01J 2237/31754* (2013.01)

(58) Field of Classification Search
CPC ..... H01J 2237/0435; H01J 2237/30472; H01J 2237/15; H01J 2237/31766; H01J 2237/30483
See application file for complete search history.

(56) References Cited

U.S. PATENT DOCUMENTS

| | | | | |
|---|---|---|---|---|
| 2004/0141169 | A1* | 7/2004 | Wieland | H01J 37/06 355/133 |
| 2009/0212240 | A1* | 8/2009 | Platzgummer | H01J 37/045 250/492.22 |
| 2012/0286170 | A1* | 11/2012 | Van De Peut | G03F 7/70475 250/397 |
| 2016/0126062 | A1* | 5/2016 | Muraki | H01J 37/3026 250/492.3 |
| 2016/0155608 | A1 | 6/2016 | Inoue | |
| 2017/0103869 | A1 | 4/2017 | Matsumoto | |

FOREIGN PATENT DOCUMENTS

| | | |
|---|---|---|
| KR | 10-2015-0135099 A | 12/2015 |
| KR | 10-2016-0065042 A | 6/2016 |

OTHER PUBLICATIONS

Korean Office Action dated Dec. 10, 2019, in Patent Application No. 10-2018-0166202, citing documents AO-AP therein, 10 pages (with unedited computer generated English translation).

Combined Taiwanese Office Action and Search Report dated Oct. 8, 2019 in Patent Application No. 107141993 (with English translation), citing document AA therein, 10 pages.

\* cited by examiner

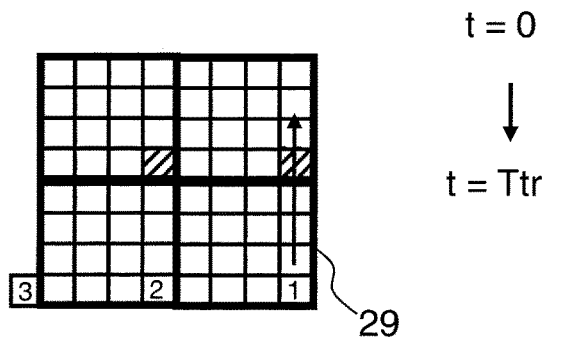
FIG.9A
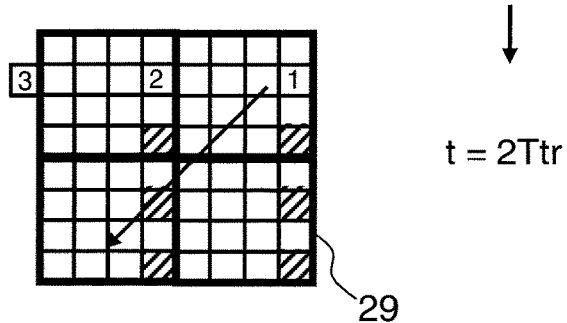
FIG.9B
FIG.9C
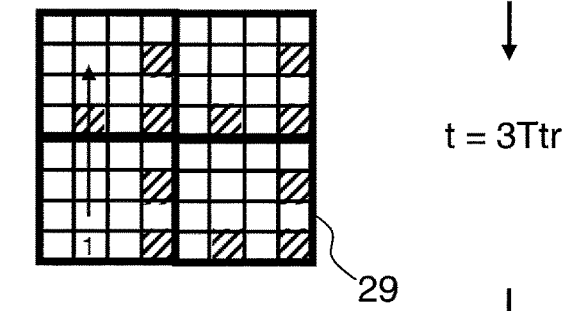
FIG.9D
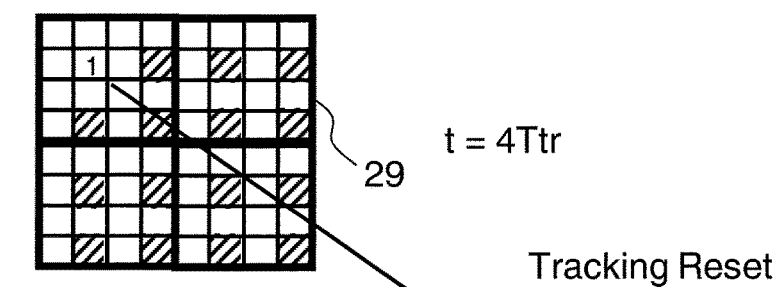
FIG.9E
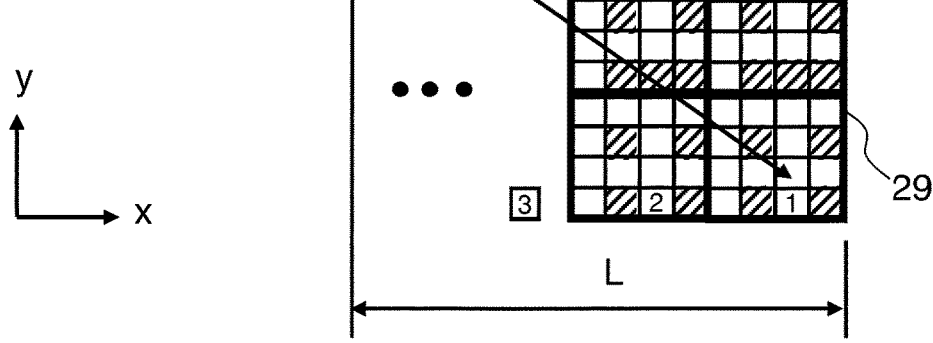

MULTIPLE CHARGED PARTICLE BEAM WRITING METHOD AND APPARATUS USING BEAMS FOR STRADDLING REGIONS

CROSS-REFERENCE TO RELATED APPLICATION

This application is based upon and claims the benefit of priority from prior Japanese Patent Application No. 2017-249435 filed on Dec. 26, 2017 in Japan, the entire contents of which are incorporated herein by reference.

BACKGROUND OF THE INVENTION

Field of the Invention

Embodiments of the present invention relate to a multiple charged particle beam writing apparatus and a multiple charged particle beam writing method, and, for example, relate to a method for reducing influence of error resulting from respective beams in multi-beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique, which intrinsically has excellent resolution, is used for writing or "drawing" a mask pattern on a mask blank with electron beams.

For example, as a known example of employing the electron beam writing technique, there is a writing apparatus using multiple beams. Since it is possible for multi-beam writing to irradiate multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for each beam, reduces each unblocked beam by an optical system in order to reduce a mask image, and deflects the beam by a deflector to irradiate a desired position on a target object or "sample".

In multi-beam writing, for example, each region surrounded by the size of the pitch between beams of formed multiple beams is written with a plurality of shots of one corresponding beam. If the size of the pitch between beams is N times the shot size of each beam of multiple beams, N×N shots are needed for filling up the inside of the inter-beam pitch region. Meanwhile, beam accuracy of each formed beam may sometimes be different from each other depending on the position of a hole in the mask through which the corresponding beam pass. Therefore, writing accuracies of beam pitch regions which are irradiated with respective beams become different from each other due to accuracy differences of respective beams. Thus, it is desirable to equalize writing errors (writing accuracy difference) caused by accuracy difference of respective beams by writing each inter-beam pitch region with many different beams as many as possible not by writing it with one beam.

Further, in multi-beam writing, since it is difficult to individually perform beam deflection for each beam one by one, a deflector collectively provides deflection for the whole multiple beams. For example, a main deflector with a wide deflection swing width holds (maintains) an inter-beam pitch region associated with each beam, and a sub deflector with a narrow deflection swing width performs a plurality of shots while providing deflection in the inter-beam pitch region. For example, the main deflector holds (maintains) an inter-beam pitch region by performing tracking control to follow the stage movement, and the sub deflector gives shots of the same beam to a region, e.g., ¼ region, in the inter-beam pitch region (e.g., refer to Japanese Patent Application Laid-open (JP-A) No. 2016-001725).

Then, in order to irradiate each inter-beam pitch region with more different beams, it is necessary to shift the associated inter-beam pitch region to another inter-beam pitch region by the main deflector. For providing deflection of multiple beams by the main deflector, a settling time and an idling time for control are needed each time. Therefore, if a tracking cycle is shortened in order to increase the number of shiftings to other inter-beam pitch region, the influence of the settling time and the idling time for control, which occur at every tracking cycle, increases with respect to the throughput, thereby resulting in a problem of throughput decrease.

BRIEF SUMMARY OF THE INVENTION

According to one aspect of the present invention, a multiple charged particle writing method includes performing a tracking operation by shifting a main deflection position of multiple beams using charged particle beams in a direction of movement of a stage so that the main deflection position of the multiple beams follows the movement of the stage while a predetermined number of beam shots of the multiple beams are performed; and shifting a sub deflection position of the multiple beams so that each beam of the multiple beams straddles rectangular regions in a plurality of rectangular regions obtained by dividing a writing region of a target object into meshes by a size of a pitch between beams of the multiple beams, and the each beam is applied to a different position in each of the rectangular regions straddled, and applying a predetermined number of shots per beam using a plurality of beams in the multiple beams to each of the plurality of rectangular regions, during the tracking operation.

According to another aspect of the present invention, a multiple charged particle beam writing apparatus includes a stage configured to be movable and to mount thereon a target object, an emission source configured to emit a charged particle beam; a shaping aperture array substrate, in which a plurality of openings are formed, configured to form and shape multiple beams by letting portions of the charged particle beam individually pass through a corresponding one of the plurality of openings; a first deflector configured to perform a tracking operation by shifting a main deflection position of the multiple beams in a direction of movement of the stage so that the main deflection position of the multiple beams follows the movement of the stage; a second deflector configured to shift a sub deflection position of the multiple beams during the tracking operation; and a deflection control circuit configured to control the first deflector and the second deflector so that, during the tracking operation, each beam of the multiple beams straddles rectangular regions in a plurality of rectangular regions obtained by dividing a writing region of the target object into meshes by a size of a pitch between beams of the multiple beams, and the each beam is applied to a different position in each of the rectangular regions straddled, and so that a predetermined number of shots per beam using a plurality of beams in the multiple beams are applied to each of the plurality of rectangular regions.

BRIEF DESCRIPTION OF THE DRAWINGS

FIGS. 9A to 9E illustrate an example of a writing method of multiple beams according to the first embodiment;

DETAILED DESCRIPTION OF THE INVENTION

Embodiments below describe a method and apparatus which can write each inter-beam pitch region with more different beams while suppressing decrease of throughput in multi-beam writing.

First Embodiment

Figure 1:
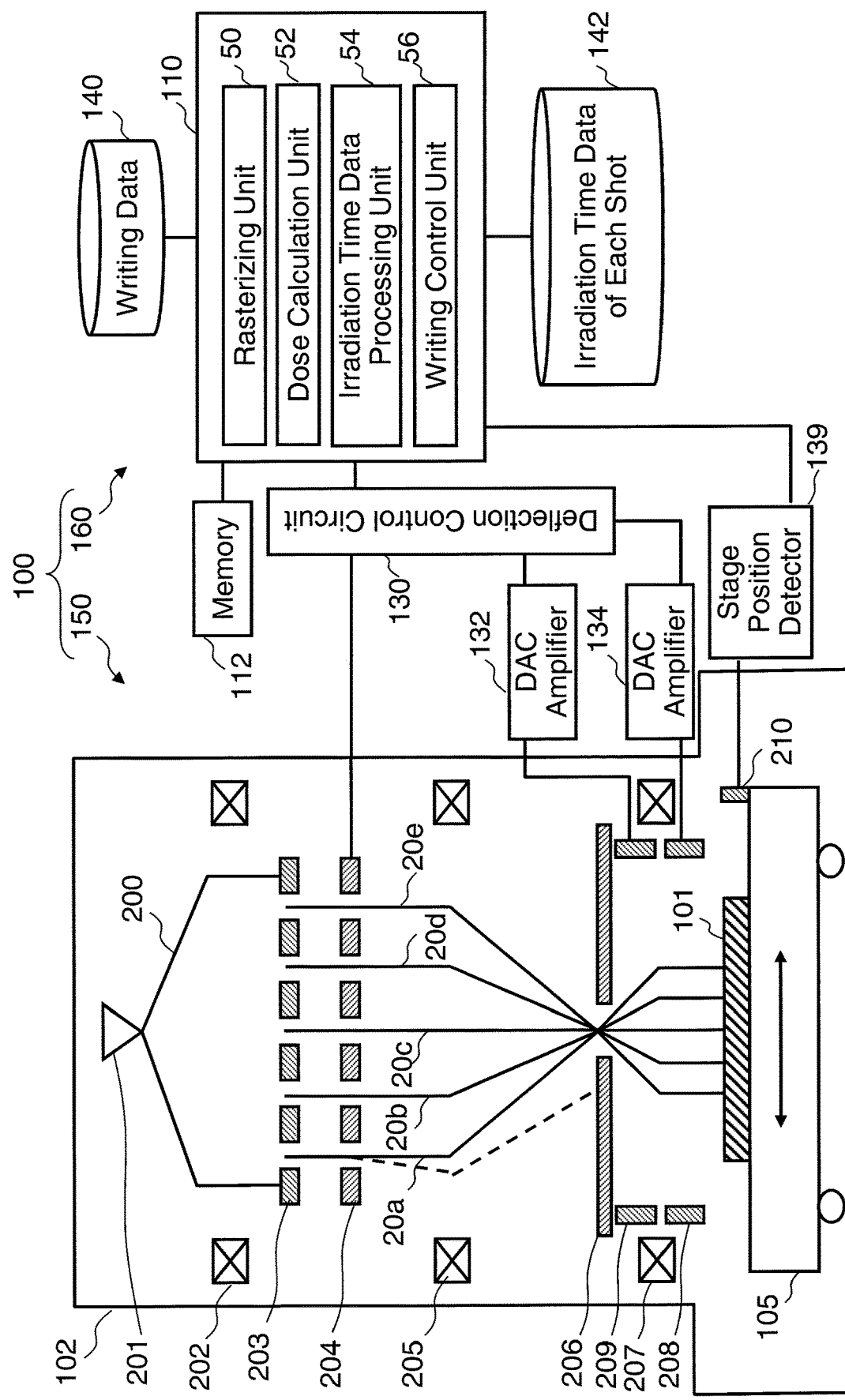
FIG. 1 is a conceptual diagram showing a configuration of a writing apparatus according to a first embodiment.

FIG. 1 is a conceptual diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multiple charged particle beam writing apparatus. The writing mechanism 150 includes an electron optical column 102 (multiple electron beam column) and a writing chamber 103. In the electron optical column 102, there are arranged an electron gun 201, an illumination lens 202, a shaping aperture array substrate 203, a blanking aperture array mechanism 204, a reducing lens 205, a limiting aperture substrate 206, an objective lens 207, a main deflector 208 (first deflector), and a sub deflector 209 (second deflector).

In the writing chamber 103, there is arranged an XY stage 105. On the XY stage 105, a target object or "sample" 101 such as a mask blank, on which resist is applied, serving as a writing target substrate is placed when writing is performed. The target object 101 is, for example, an exposure mask used for fabricating semiconductor devices, or a semiconductor substrate (silicon wafer) for fabricating semiconductor devices. Moreover, a mirror 210 for measuring the position of the XY stage 105 is disposed on the XY stage 105.

The control system circuit 160 includes control computer 110, a memory 112, a deflection control circuit 130, digital-to-analog converting (DAC) amplifier units 132 and 134, a stage position detector 139, and storage devices 140 and 142, such as magnetic disk drives. The control computer 110, the memory 112, the deflection control circuit 130, the DAC amplifier units 132 and 134, the stage position detector 139, and the storage devices 140 and 142 are connected with each other through a bus (not shown). The deflection control circuit 130 is connected to the DAC amplifier units 132 and 134, and a blanking aperture array mechanism 204. Outputs of the DAC amplifier unit 132 are connected to the sub deflector 209. Outputs of the DAC amplifier unit 134 are connected to the main deflector 208. The stage position detector 139 irradiates the mirror 210 on the XY stage 105 with a laser beam, and receives a reflected light from the mirror 210. Then, the stage position detector 139 measures the position of the XY stage 105 by using the principle of the laser interference based on information on the reflected light.

In the control computer 110, there are arranged a rasterizing unit 50, a dose calculation unit 52, an irradiation time data processing unit 54, and a writing control unit 56. Each " . . . of units" such as the rasterizing unit 50, the dose calculation unit 52, the irradiation time data processing unit 54, and the writing control unit 56 includes a processing circuitry. As the processing circuitry, for example, an electric circuit, computer, processor, circuit board, quantum circuit, or semiconductor device is used. Each " . . . unit" may use a common processing circuitry (same processing circuitry), or different processing circuitries (separate processing circuitries). Information input and output to/from the rasterizing unit 50, the dose calculation unit 52, the irradiation time data processing unit 54, and the writing control unit 56, and information being operated are stored in the memory 112 each time.

Moreover, writing data is input from the outside of the writing apparatus 100, and stored in the storage device 140. The writing data usually defines information on a plurality of figure patterns to be written. Specifically, it defines a figure code, coordinates, size, etc. of each figure pattern. Alternatively, it defines a figure code, coordinates of each vertex, etc. of each figure pattern.

FIG. 1 shows structure elements necessary for describing the first embodiment. It should be understood that other structure elements generally necessary for the writing apparatus 100 may also be included therein.

Figure 2:
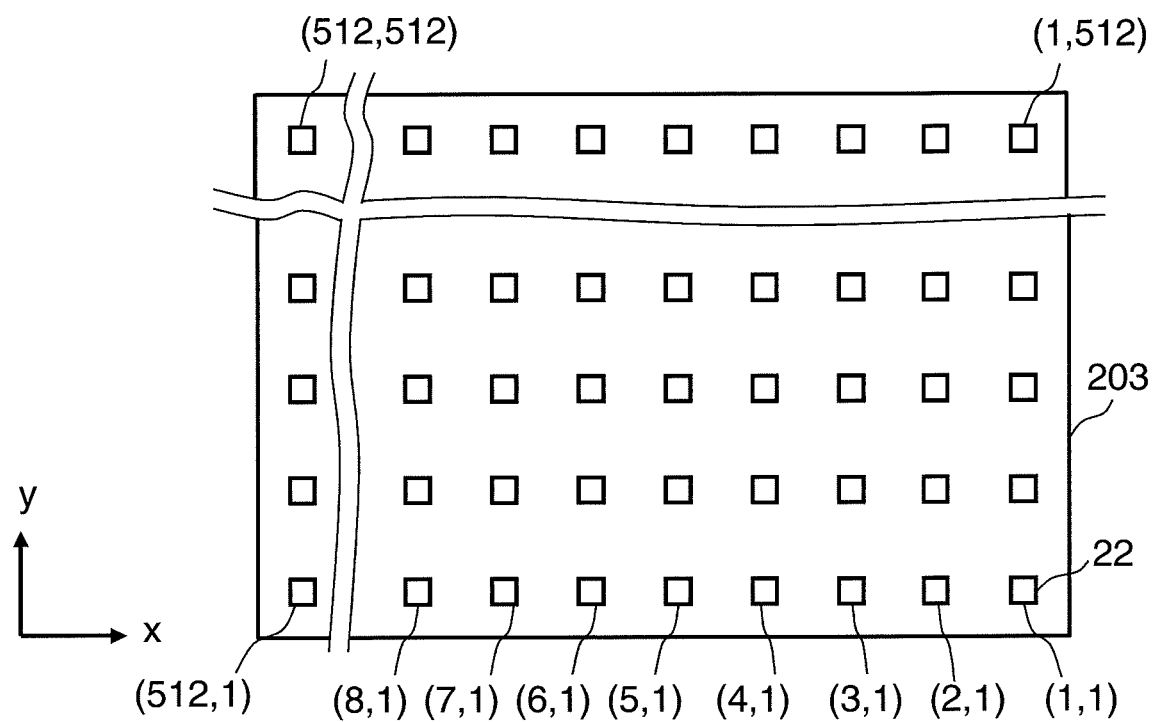
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings, apertures) 22 of p rows long (length in the y direction) and q columns wide (width in x direction) (p≥2, q≥2) are formed, like a matrix, at a predetermined arrangement pitch in the shaping aperture array substrate 203. In FIG. 2, for example, holes 22 of 512 (rows of holes arrayed in y direction)×512 (columns of holes arrayed in x direction) are formed. Each of the holes 22 is a rectangle, including a square, having the same dimension and shape. Alternatively, each of the holes 22 may be a circle with the same diameter. By making portions of an electron beam 200 individually pass through a corresponding hole of a plurality of holes 22, multiple beams 20 are formed. The method of arranging the holes 22 is not limited to the case of FIG. 2 where holes are arranged in a grid form in the length and width directions. For example, with respect to the kth and the (k+1)th rows which are arrayed (accumulated) in the length direction (y direction), each hole in the kth row and each hole in the (k+1)th row may be mutually displaced in the width direction (x direction) by a dimension "a". Similarly, with respect to the (k+1)th and the (k+2)th rows which are arrayed (accumulated) in the length direction (y direction), each hole in the (k+1)th row and each hole in the (k+2)th row may be mutually displaced in the width direction (x direction) by a dimension "b", for example.

Figure 3:
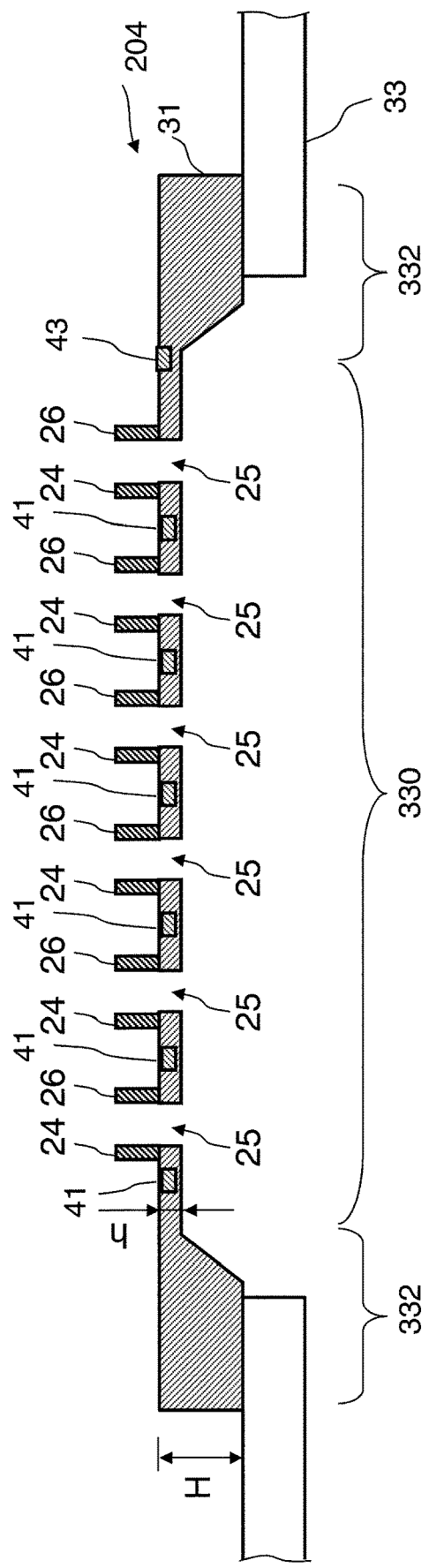
FIG. 3 is a sectional view showing a configuration of a blanking aperture array mechanism according to the first embodiment.

FIG. 3 is a sectional view showing a configuration of a blanking aperture array mechanism according to the first embodiment.

Figure 4:
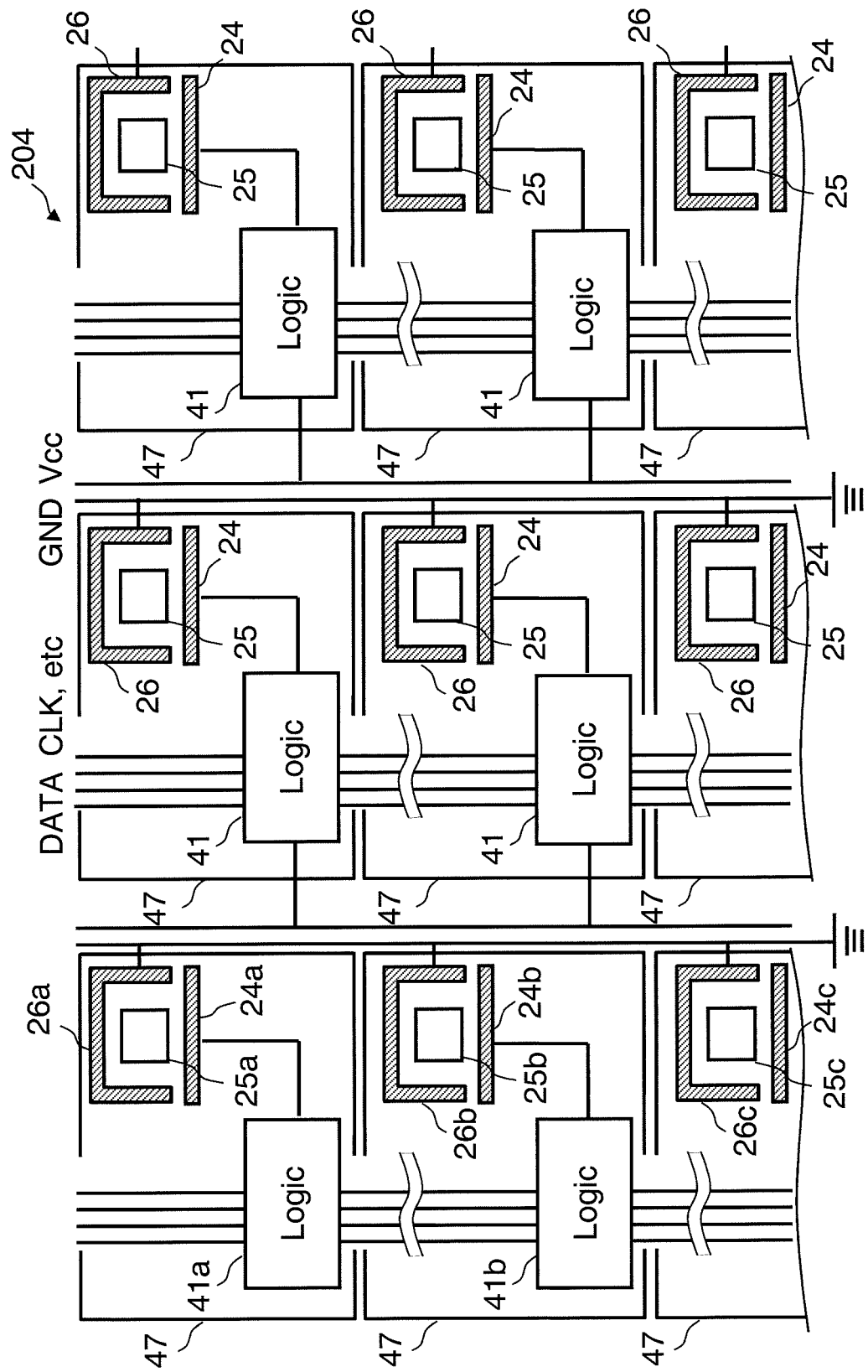
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. The position relation of a control electrode 24, a counter electrode 26, a control circuit 41, and a pad 43 in FIG. 3 is not in accordance with that of FIG. 4. With regard to the structure of the blanking aperture array mechanism 204, a semiconductor substrate 31 made of silicon, etc. is placed on a support table 33. The central part of the substrate 31 is shaved from the back side, and made into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of multiple beams passes are formed at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multiple beams passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIGS. 3 and 4, each pair (blanker: blanking deflector) of the control electrode 24 and the counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 4, n-bit (e.g., 10-bit) parallel lines for control signals are connected to each control circuit 41. In addition to the n-bit parallel lines for controlling signals, lines for a clock signal, a read signal, a shot signal, a power supply, and the like are connected to each control circuit 41. Alternatively, a part of the parallel lines may be used as the lines for a clock signal, a read signal, a shot signal, a power supply, and the like. An individual blanking mechanism 47 composed of the control electrode 24, the counter electrode 26, and the control circuit 41 is configured for each of the multiple beams. In the example of FIG. 3, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped, for example, per row or per column, and the control circuits 41 in each group are connected in series as shown in FIG. 4. Then, the pad 43 arranged for each group sends a signal to the control circuits 41 in the group concerned. Specifically, a shift register (not shown) is arranged in each control circuit 41, and for example, shift registers in the control circuits 41 for beams in the same row in p×q multiple beams, for example, are connected in series. For example, control signals for beams in the same row in the p×q multiple beams are transmitted in series, and, for example, a control signal for each beam is stored in a corresponding control circuit 41 by p clock signals totally.

Figure 5:
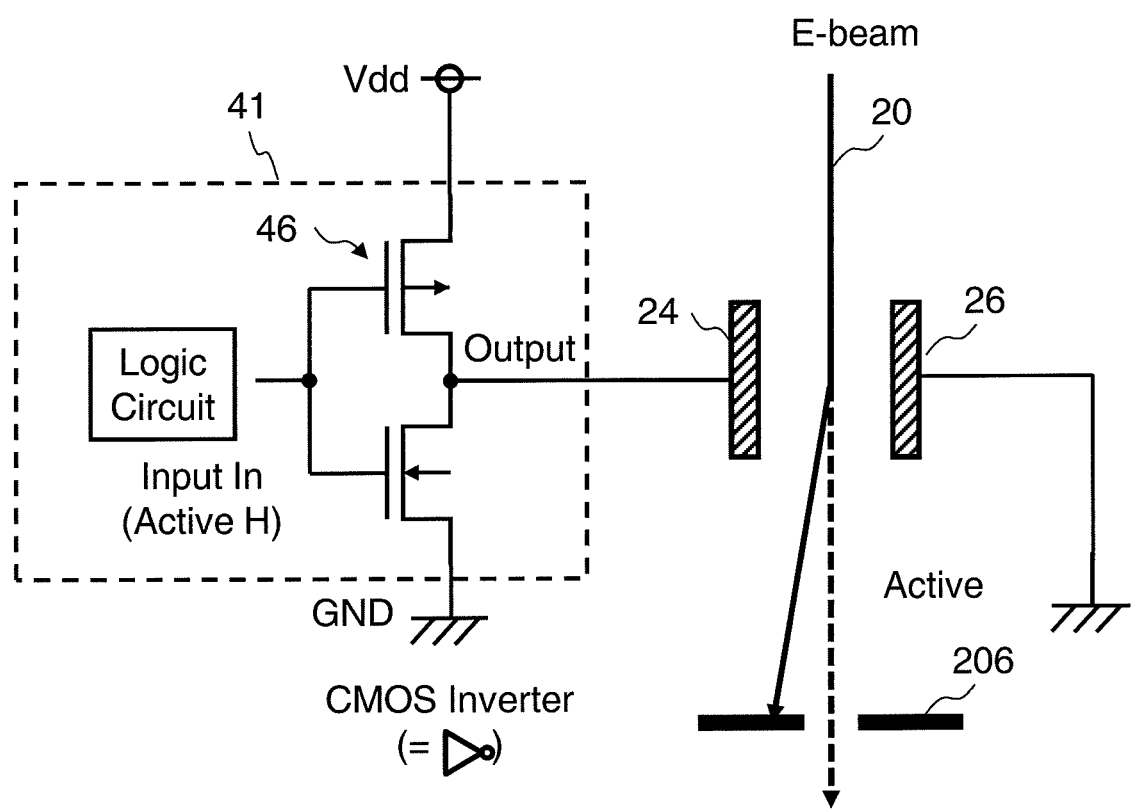
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that each control electrode 24 and the corresponding counter electrode 26 are opposite to each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state where an L electric potential is applied to the input (IN) of the CMOS inverter circuit, the output (OUT) of the CMOS inverter circuit becomes a positive potential (Vdd), and then, a corresponding electron beam 20 is deflected by an electric field due to a potential difference from the ground potential of the counter electrode 26 so as to be blocked by the limiting aperture substrate 206, thereby being controlled to be in a beam OFF condition. On the other hand, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding electron beam 20 is not deflected, thereby being controlled to be in a beam ON condition by making the beam concerned pass through the limiting aperture substrate 206.

The electron beam 20 passing through a corresponding passage hole is deflected by a voltage independently applied to a pair of the control electrode 24 and the counter electrode 26. Blanking control is performed by this deflection. Specifically, a pair of the control electrode 24 and the counter electrode 26 individually provides blanking deflection of a corresponding electron beam of multiple beams by an electric potential switchable by the CMOS inverter circuit which serves as a corresponding switching circuit. Thus, each of a plurality of blankers performs blanking deflection of a corresponding beam in the multiple beams having passed through a plurality of holes 22 (openings) in the shaping aperture array substrate 203.

Next, operations of the writing mechanism 150 of the writing apparatus 100 will be described. The electron beam 200 emitted from the electron gun 201 (emission source) almost perpendicularly (e.g., vertically) illuminates the whole of the shaping aperture array substrate 203 by the illumination lens 202. A plurality of rectangular (including square, etc.) holes (openings) are formed in the shaping aperture array substrate 203. The region including all the plurality of holes is irradiated with the electron beam 200. For example, a plurality of rectangular, including a square, electron beams (multiple beams) 20a to 20e are formed by letting portions of the electron beam 200, which irradiates the positions of a plurality of holes, individually pass through a corresponding hole of the plurality of holes of the shaping aperture array substrate 203. The multiple beams 20a to 20e individually pass through corresponding blankers (first deflector: individual blanking mechanism) of the blanking aperture array mechanism 204. Each blanker deflects (provides blanking deflection) the electron beam 20 which is individually passing.

The multiple beams 20a to 20e having passed through the blanking aperture array mechanism 204 are reduced by the reducing lens 205, and go toward the hole in the center of the limiting aperture substrate 206. At this stage, the electron beam 20a which was deflected by the blanker of the blanking aperture array mechanism 204 deviates (shifts) from the hole in the center of the limiting aperture substrate 206 and is blocked by the limiting aperture substrate 206. On the other hand, the electron beams 20b to 20e which were not deflected by the blanker of the blanking aperture array mechanism 204 pass through the hole in the center of the limiting aperture substrate 206 as shown in FIG. 1. Blanking control is provided by ON/OFF of the individual blanking mechanism so as to control ON/OFF of beams. Thus, the limiting aperture substrate 206 blocks each beam which was deflected to be in the OFF state by the individual blanking mechanism 47. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams (the whole of the multiple beams 20) having passed through the limiting aperture substrate 206 are collectively deflected in the same direction by the main deflector 209 and the sub deflector 209 in order to irradiate respective beam irradiation positions on the target object 101. Ideally, the multiple beams 20 irradiating at a time are aligned at pitches obtained by multiplying the arrangement pitch of a plurality of holes of the shaping aperture array substrate 203 by a desired reduction ratio described above.

Figure 6:
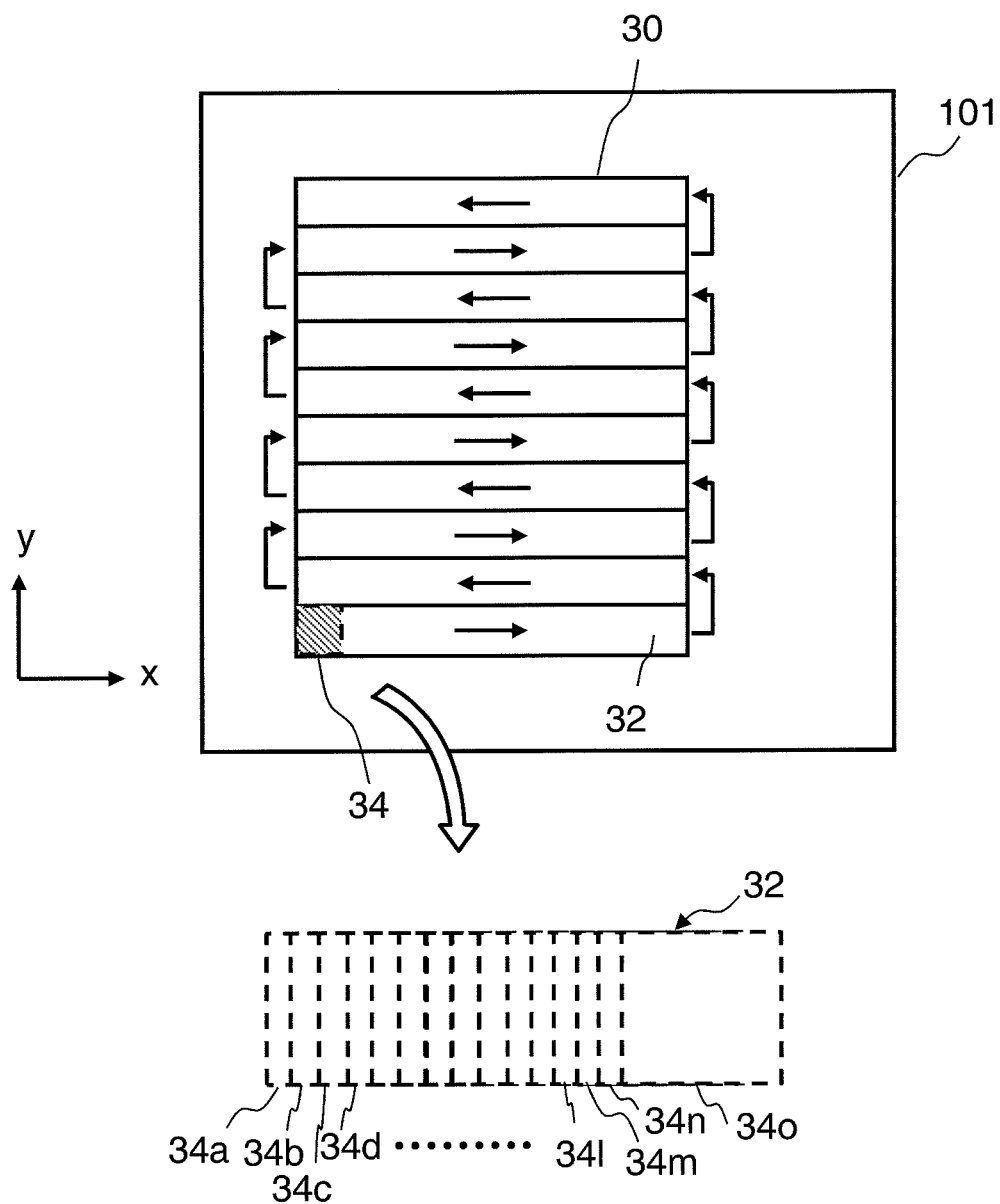
FIG. 6 is a conceptual diagram explaining an example of a writing operation according to the first embodiment.

FIG. 6 is a conceptual diagram explaining an example of a writing operation according to the first embodiment. As shown in FIG. 6, a writing region 30 of the target object 101 is virtually divided by a predetermined width in the y direction into a plurality of stripe regions 32 in a strip form, for example. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end and located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns up to as many as the number of the holes 22 are formed at a time by one shot of multiple beams having been formed by passing through the holes 22 in the shaping aperture array substrate 203.

Figure 7:
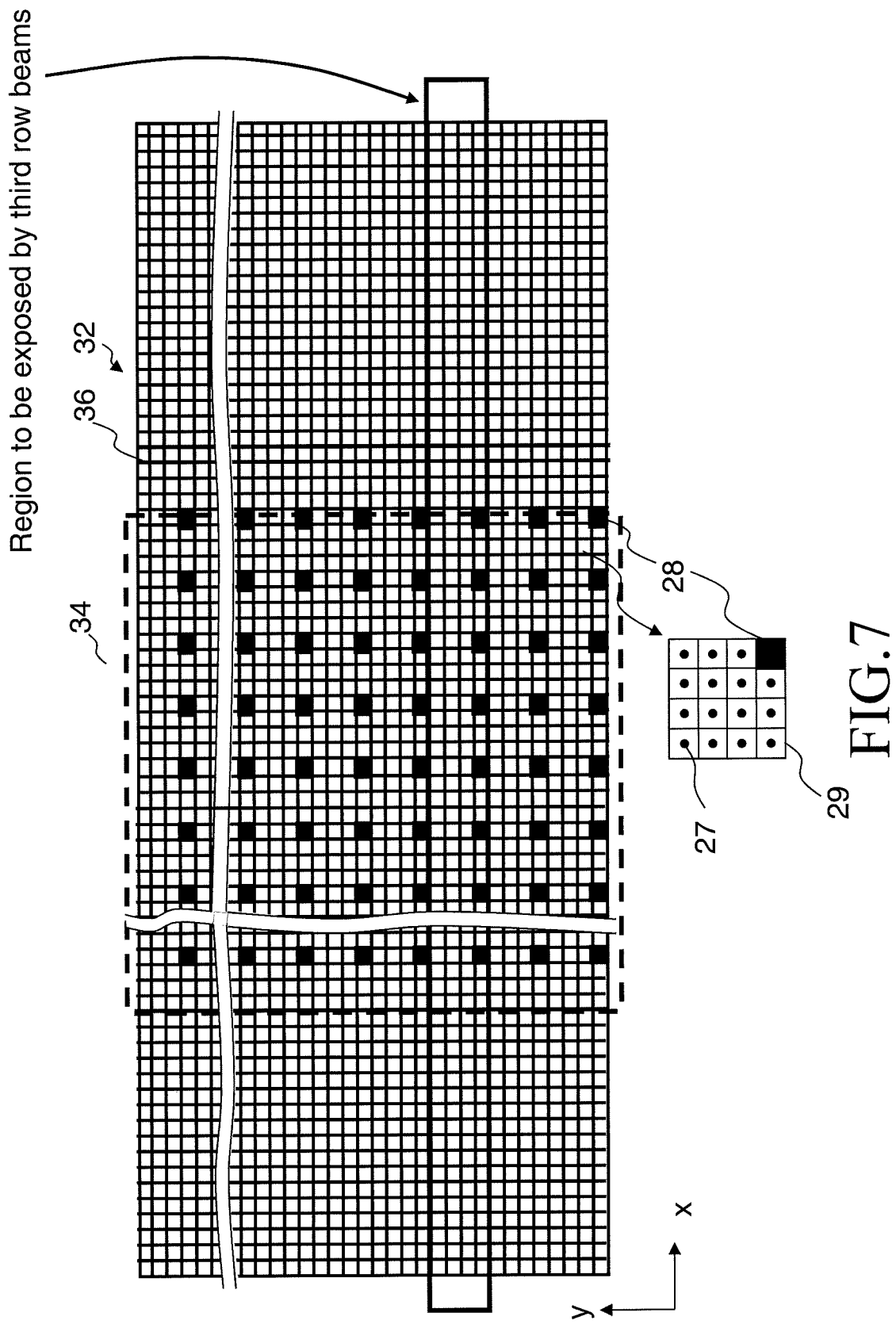
FIG. 7 shows an example of an irradiation region of multiple beams and a pixel to be written according to the first embodiment.

FIG. 7 shows an example of an irradiation region of multiple beams and a pixel to be written (writing target pixel) according to the first embodiment. In FIG. 7, in the stripe region 32, there are set a plurality of control grids 27 (design grids) arranged in a grid form at the beam size pitch of the multiple beams 20 on the surface of the target object 101, for example. Preferably, they are arranged at an arrangement pitch of around 10 nm. A plurality of control grids 27 serve as design irradiation positions of the multiple beams 20. The arrangement pitch of the control grid 27 is not limited to the beam size, and may be an arbitrary size which can be controlled as a deflection position of the sub deflector 209, regardless of the beam size. Then, a plurality of pixels 36 obtained by virtually dividing into a mesh form by the same size as that of the arrangement pitch of the control grid 27 are set, each of which is centering on each control grid 27. Each pixel 36 serves as an irradiation unit region per beam of multiple beams. FIG. 7 shows the case where the writing region of the target object 101 is divided, for example, in the y direction, into a plurality of stripe regions 32 by the width size being substantially the same as the size of the irradiation region 34 (writing field) which can be irradiated with one irradiation of the multiple beams 20. The x-direction size of the irradiation region 34 can be defined by the value obtained by multiplying the pitch between beams in the x direction of the multiple beams 20 by the number of beams in the x direction. The y-direction size of the irradiation region 34 can be defined by the value obtained by multiplying the pitch between beams in the y direction of the multiple beams 20 by the number of beams in the y direction. The width of the stripe region 32 is not limited to this. Preferably, the width of the stripe region 32 is n times (n being an integer of 1 or greater) the size of the irradiation region 34. FIG. 7 shows the case of multiple beams of 512×512 (rows×columns) being simplified to 8×8 (rows× columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 7, one sub-irradiation region 29 (inter-beam pitch region) is a rectangular region, including a square region, surrounded by four adjacent pixels 28 at four corners and including one of the four pixels 28. In the case of FIG. 7, each sub-irradiation region 29 is composed of 4×4(=16) pixels.

Figure 8:
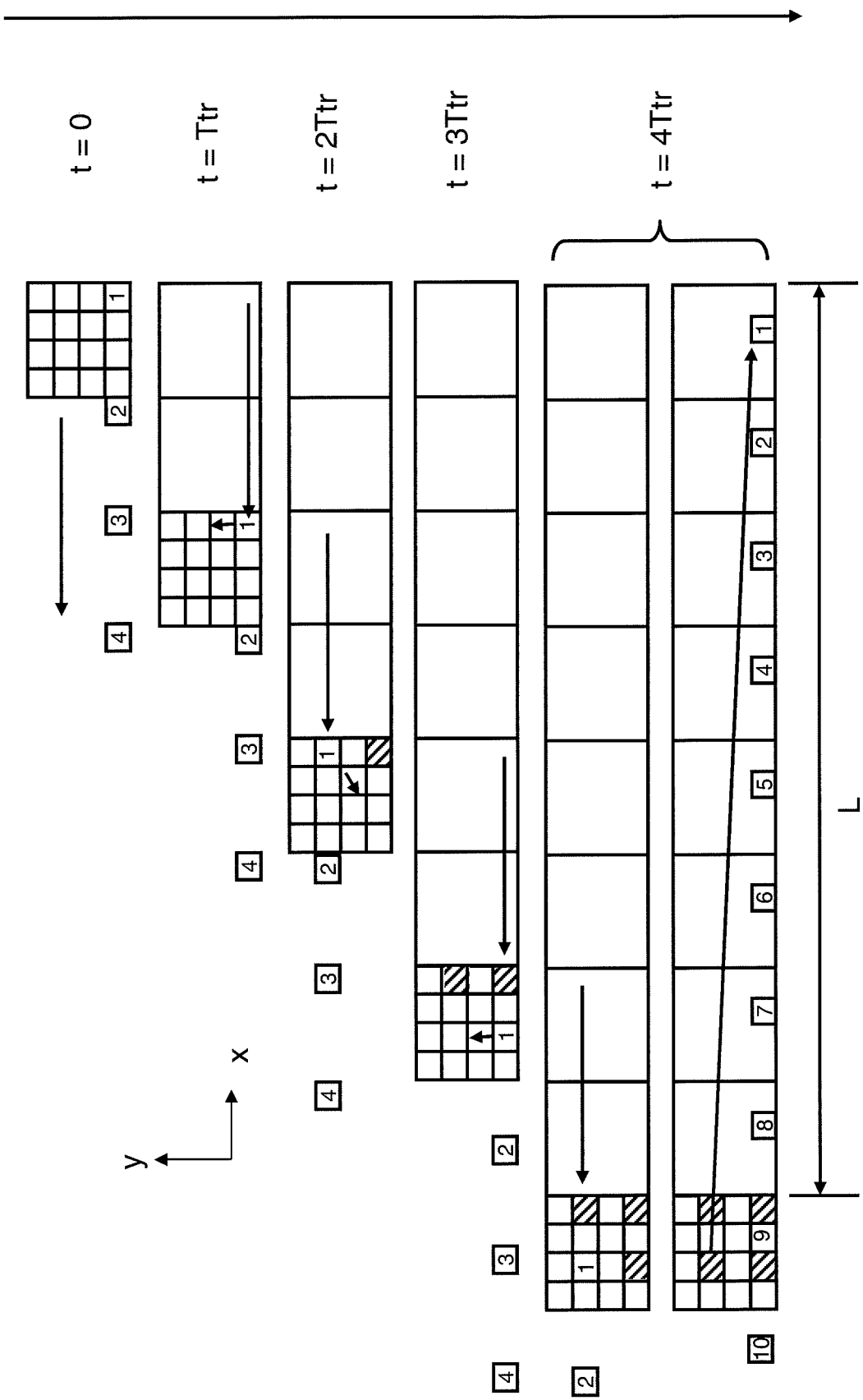
FIG. 8 illustrates an example of a writing method of multiple beams according to a comparative example of the first embodiment.

FIG. 8 illustrates an example of a writing method of multiple beams according to a comparative example of the first embodiment. FIG. 8 shows a part of the sub-irradiation region 29 to be written by respective beams at the coordinates (1, 3), (2, 3), (3, 3), . . . , (512, 3) in the third row from the bottom in the multiple beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting all the multiple beams 20 by the main deflector 208. In other words, tracking control is performed. In the case of FIG. 8, one tracking cycle is executed by writing (exposing) four pixels while moving the distance of eight beam pitches.

In the example of FIG. 8, during the time from t=0 to t=maximum irradiation time Ttr, the control grid 27 of the first pixel 36 from the right in the bottom row of the sub-irradiation region 29 concerned is irradiated with the first shot of the beam (1) at coordinates (1, 3), for example. Thereby, the pixel concerned has received beam irradiation of a desired irradiation time. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation of the shot concerned, while the beam deflection for tracking control is continuously performed by the main deflector 208, the writing position (previous writing position) of each beam is shifted to a next writing position (current writing position) of each beam by collectively deflecting the multiple beams 20 by the sub deflector 209, which is performed in addition to the beam deflection for tracking control. In the example of FIG. 8, when the time becomes t=Ttr, the target control grid 27 to be written is shifted from the control grid 27 of the first pixel 36 from the right in the bottom row of the sub-irradiation region 29 concerned to the control grid 27 of the first pixel 36 from the right in the third row from the bottom. Since the XY stage 105 is moving at a fixed speed also during this time period, the tracking operation is continuously performed.

Then, while the tracking control is continuously performed, respective corresponding beams in the ON state in the multiple beams 20 are applied to the shifted writing positions corresponding to the respective beams during a writing time corresponding to each of the respective beams within the maximum irradiation time Ttr of the shot concerned. In the example of FIG. 8, during the time from t=Ttr to t=2Ttr, the control grid 27 of the first pixel 36 from the right in the third row from the bottom of the sub-irradiation region 29 concerned is irradiated with the second shot of the beam (1) at the coordinates (1, 3), for example. The XY stage 105 moves two beam pitches in the −x direction during the time from t=Ttr to t=2Ttr, for example. During this time period, the tracking operation is continuously performed.

In the example of FIG. 8, when the time becomes t=2Ttr, the target control grid 27 to be written is shifted from the control grid 27 of the first pixel 36 from the right in the third row from the bottom of the sub-irradiation region 29 concerned to the control grid 27 of the third pixel 36 from the right in the bottom row by collective deflection of the multiple beams by the sub deflector 209. Since the XY stage 105 is moving also during this time period, the tracking operation is continuously performed. Then, during the time from t=2Ttr to t=3Ttr, the control grid 27 of the third pixel 36 from the right in the first row from the bottom of the sub-irradiation region 29 concerned is irradiated with the third shot of the beam (1) at the coordinates (1, 3), for example. Thereby, the control grid 27 of the pixel 36 concerned has received beam irradiation of a desired irradiation time.

The XY stage 105 moves two beam pitches in the −x direction during the time from t=2Ttr to t=3Ttr, for example. During this time period, the tracking operation is continuously performed. When the time becomes t=3Ttr, the target control grid 27 to be written is shifted from the control grid 27 of the third pixel 36 from the right in the first row from the bottom of the sub-irradiation region 29 concerned to the control grid 27 of the third pixel 36 from the right in the third row from the bottom by collectively deflecting the multiple beams by the sub deflector 209. Since the XY stage 105 is moving also during this time period, the tracking operation is continuously performed.

During the time from t=3Ttr to t=4Ttr, the control grid 27 of the third pixel 36 from the right in the third row from the bottom of the sub-irradiation region 29 concerned is irradiated with the fourth shot of the beam (1) at the coordinates (1, 3), for example. Thereby, the control grid 27 of the pixel 36 concerned has received beam irradiation of a desired irradiation time.

The XY stage 105 moves two beam pitches in the −x direction during the time from t=3Ttr to t=4Ttr, for example. During this time period, the tracking operation is continuously performed. Thus, in this manner, writing of the total four pixels of the sub-irradiation region 29 concerned has been completed, namely, the first pixel from the right in the first row from the bottom, the first pixel from the right in the third row from the bottom, the third pixel from the right in the first row from the bottom, and the third pixel from the right in the third row from the bottom of the sub-irradiation region 29 concerned.

In the example of FIG. 8, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 8, when the time becomes t=4Ttr, tracking of the sub-irradiation region 29 concerned is cancelled, and the beam is swung back to a new sub-irradiation region 29 which has been shifted by eight beam pitches in the x direction. Although the beam (1) at the coordinates (1, 3) has been described in the example of FIG. 8, writing is also similarly performed for each sub-irradiation region 29 corresponding to a beam at other coordinates. That is, when the time becomes t=4Ttr, the beam at coordinates (m, m') completes writing of the total four pixels of a corresponding sub-irradiation region 29, namely, the first pixel from the right in the first row from the bottom, the first pixel from the right in the third row from the bottom, the third pixel from the right in the first row from the bottom, and the third pixel from the right in the third row from the bottom. For example, with respect to another sub-irradiation region 29 adjacent in the −x direction to the sub-irradiation region 29 for the beam (1) of FIG. 8, the beam (2) at coordinates (2, 3) completes writing of the total four pixels, namely, the first pixel from the right in the first row from the bottom, the first pixel from the right in the third row from the bottom, the third pixel from the right in the first row from the bottom, and the third pixel from the right in the third row from the bottom.

Since writing has been completed in the total four pixels, namely, the first pixel from the right in the first row from the bottom, the first pixel from the right in the third row from the bottom, the third pixel from the right in the first row from the bottom, and the third pixel from the right in the third row from the bottom of each sub-irradiation region 29, the sub deflector 209 performs, in the next tracking cycle after resetting the tracking, deflection so that the writing position of each corresponding beam may be adjusted (shifted) to the control grid 27 of a pixel in which nothing has been written. For example, the writing position of each corresponding beam is adjusted (shifted) to the control grid 27 of the second pixel from the right in the bottom row of each sub-irradiation region 29.

As described above, in the state where the relative position of the irradiation region 34 to the target object 101 is controlled by the main deflector 208 to be an unchanged position during the same tracking cycle, each shot is performed while shifting in the sub-irradiation region 29 by the sub deflector 209. Then, after finishing one tracking cycle and returning the tracking position of the irradiation region 34, as shown in the lower part of FIG. 8, the first shot position is adjusted to the position shifted by one control grid (one pixel), for example, and each shot is performed shifting in the sub-irradiation region 29 by the sub deflector 209 while a next tracking control is performed. Also, with respect to other regions each composed of n×n pixels in the irradiation region of multiple beams, the same operation is executed at the same time to perform similar writing. By repeating this operation during writing the stripe region 32, the position of the irradiation region 34 is shifted one by one, such as from 34a to 34o, to perform writing of the stripe region concerned.

In a comparative example of the first embodiment, since n' tracking cycles are performed to write the whole of the sub-irradiation region 29 composed of n×n pixels, the sub-irradiation region 29 of n×n pixels is written by n' different beams which have passed through different holes 22 in the shaping aperture array substrates 203. Specifically, writing is performed for each n'' (n''=(n×n)/n') pixels by one of the n' different beams which has passed through the same hole 22 in the shaping aperture array substrates 203. Therefore, if the one beam concerned has poor accuracy or is a defective beam, 1/n' of the sub-irradiation region 29 concerned includes writing error. In the case of FIG. 8, four pixels of the sub-irradiation region 29 composed of sixteen pixels include writing errors. Then, according to the first embodiment, the writing method is changed so that the sub-irradiation region 29 of n×n pixels may be written by different beams greater than n' beams, wherein the different beams have passed through different holes 22 in the shaping aperture array substrates 203. Here, in order to write the whole of the sub-irradiation region 29 of n×n pixels, n' tracking cycles each composed of n'' shots of the multiple beams 20 are performed. This condition is maintained. Thereby, it is possible to avoid increasing the number of occurrences of the settling time and control idling time, needed for each tracking cycle, of DAC amplifier for main deflector 208. In order to satisfy the condition, according to the first embodiment, the deflection swing width of the sub deflector 209 which has performed deflection in the range of the sub-irradiation region 29 is increased.

According to the first embodiment, while the main deflector 208 performs multiple electron beam shots being n'' shots (predetermined shot number), a tracking operation of the main deflection position of the multiple beams 20 is performed in the moving direction of the XY stage 105 so that the main deflection position of the multiple beams 20 may follow the movement of the XY stage 105. It is preferable that the center position of the irradiation region 34 is used as the main deflection position of the multiple beams 20, for example. Alternatively, it is also preferable to use one (e.g., lower left corner) of the four corners of the irradiation region 34. Similarly to the example of FIG. 8, the case where, during one tracking cycle, four pixels are written (exposed), that is, four shots are performed, while moving the distance of eight beam pitches is described below.

According to the first embodiment, the deflection control circuit 130 controls the main deflector 208 and the sub deflector 209 so that, during one tracking operation, the sub deflection position of the multiple beams 20 may be shifted such that each beam of the multiple beams 20 straddles the sub-irradiation regions 29 among a plurality of sub-irradiation regions 29 obtained by dividing the writing region of the target object 101 into mesh-like regions by the size of a pitch between beams of the multiple beams 20, the each beam is applied to each different position in each of the sub-irradiation regions 29 straddled, and each sub-irradiation region 29 may be irradiated with a predetermined number of shots per beam using a plurality of beams in the multiple beams 20. In other words, the deflection control circuit 130 controls the main deflector 208 and the sub deflector 209 so that, during a tracking operation, the sub deflection position of the multiple beams 20 may be shifted such that the irradiation position of each beam may straddle the sub-irradiation regions 29, the irradiation position of each beam in the sub-irradiation region 29 may be different from each other among the straddled sub-irradiation regions 29, and the number of shots per beam, using the beams concerned in each sub-irradiation region 29, may be the same as each other among the straddled sub-irradiation regions 29. Simultaneously, the deflection control circuit 130 controls the main deflector 208 and the sub deflector 209 so that each sub-irradiation region 29 may be irradiated with shots of the number (predetermined shot number) to be performed in one tracking cycle of a plurality of beams in the multiple beams 20. Similarly to the main deflection position, it is preferable that the center position of the irradiation region 34 is used as a sub deflection position of the multiple beams 20, for example. Alternatively, it is also preferable to use one (e.g., lower left corner) of the four corners of the irradiation region 34. Here, the case of using the sub deflector 209 with a deflection swing width capable of deflecting two inter-beam pitches in each of the x and y directions, for example, will be described.

FIGS. 9A to 9E illustrate an example of a writing method of multiple beams according to the first embodiment. Similarly to FIG. 8, FIGS. 9A to 9E show a part of the sub-irradiation region 29 to be written by respective beams at the coordinates (1, 3), (2, 3), (3, 3), . . . , (512, 3) in the third row from the bottom, and respective beams in the fourth row from the bottom in the multiple beams for writing the stripe region 32. In the example of FIGS. 9A to 9E, while the XY stage 105 moves the distance of eight beam pitches, four pixels are written (exposed), for example. In order that the relative position between the irradiation region 34 and the target object 101 may not be shifted by the movement of the XY stage 105 while these four pixels are written (exposed), the irradiation region 34 is made to follow the movement of the XY stage 105 by collectively deflecting all the multiple beams 20 by the main deflector 208. In other words, tracking control is performed. In the case of FIGS. 9A to 9E, during one tracking cycle, four pixels are written (exposed) while moving the distance of eight beam pitches.

Specifically, the stage position detector 139 measures the position of the XY stage 105 by irradiating the mirror 210 with a laser and receiving a reflected light from the mirror 210. The measured position of the XY stage 105 is output to the control computer 110. In the control computer 110, the writing control unit 56 outputs the position information on the XY stage 105 to the deflection control circuit 130. While being in accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier unit 134. The DAC amplifier unit 134 converts the digital signal to an analog signal and amplifies it to be applied as a tracking deflection voltage to the main deflector 208.

The writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each of the multiple beams of the shot concerned.

In the example of FIG. 9A, similarly to FIG. 8, during the time from t=0 to t=maximum irradiation time Ttr, the control grid 27 of the first pixel 36 from the right in the bottom row of the sub-irradiation region 29 concerned is irradiated with the first shot of the beam (1) at coordinates (1, 3), for example. Thereby, the pixel concerned has received beam irradiation of a desired irradiation time. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation of the shot concerned, while the beam deflection for tracking control is continuously performed by the main deflector 208, the writing position (previous writing position) of each beam is shifted to a next writing position (current writing position) of each beam by collectively deflecting the multiple beams 20 by the sub deflector 209, which is performed in addition to the beam deflection for tracking control. Here, as shown in FIG. 9A, when the time becomes t=Ttr, it is shifted to another sub-irradiation region 29 adjacent in the y direction to the sub-irradiation region 29 concerned. In other words, during one tracking operation, the sub deflection position of the multiple beams 20 is shifted so that the irradiation position of each beam may straddle the sub-irradiation regions 29 in a plurality of sub-irradiation regions 29 (rectangular region) obtained by dividing the writing region 30 (or stripe region 32) of the target object 101 into mesh-like regions by the pitch size between beams of the multiple beams 20. In this case, here, the target control grid 27 to be written is shifted from the first control grid 27 from the right in the bottom row of the sub-irradiation region 29 concerned shown in FIG. 9A to the first control grid 27 from the right in the third row from the bottom in another sub-irradiation region 29 shown in FIG. 9B adjacent in the y direction to the sub-irradiation region 29 concerned. In other words, the sub deflection position of the multiple beams 20 is shifted so that the irradiation position of each beam in one sub-irradiation region 29 may be different from each other among the straddled sub-irradiation regions 29. As long as this shifting operation is performed within the range of the deflection swing width of the sub deflector 209, the settling time of the DAC amplifier for sub deflector 209 does not increase. Thus, it is possible to suppress increase in the settling time by performing shifting among the sub-irradiation regions 29 by the sub deflector 209 with a deflection swing width capable of deflecting two inter-beam pitches sufficiently smaller compared with the main deflector 208 with a deflection swing width capable of deflecting eight inter-beam pitches as shown in the example of FIG. 8. Therefore, it is possible to perform shifting of the pixel position to another sub-irradiation region 29 while taking the same time as the case of shifting the pixel position in the same sub-irradiation region 29. Since the XY stage 105 is moving at a fixed speed also during this time period, the tracking operation by the main deflector 208 is continuously performed.

Then, while the tracking control is continuously performed, respective corresponding beams in the ON state in the multiple beams 20 are applied to the shifted writing positions corresponding to the respective beams during a writing time corresponding to each of the respective beams within the maximum irradiation time Ttr of the shot concerned. In the example of FIG. 9B, during the time from t=Ttr to t=2Ttr, the control grid 27 of the first pixel 36 from the right in the third row from the bottom of another sub-irradiation region 29 adjacent in the y direction to the sub-irradiation region 29 concerned is irradiated with the second shot of the beam (1) at the coordinates (1, 3), for example. The XY stage 105 moves, for example, two beam pitches in the −x direction during the time from t=Ttr to t=2Ttr. During this time period, the tracking operation by the main deflector 208 is continuously performed.

In the example of FIG. 9B, when the time becomes t=2Ttr, the target control grid 27 to be written is shifted from the control grid 27 of the first pixel 36 from the right in the third row from the bottom of another sub-irradiation region 29 adjacent in the y direction to the sub-irradiation region 29 concerned to the control grid 27 of the third pixel 36 from the right in the first row from the bottom of yet another sub-irradiation region 29 adjacent in the −x direction to the sub-irradiation region 29 concerned by collectively deflecting the multiple beams by the sub deflector 209. Since the XY stage 105 is moving also during this time period, the tracking operation is continuously performed. Then, as shown in FIG. 9C, during the time from t=2Ttr to t=3Ttr, the control grid 27 of the third pixel 36 from the right in the first row from the bottom of the sub-irradiation region 29 adjacent in the −x direction to the sub-irradiation region 29 concerned is irradiated with the third shot of the beam (1) at the coordinates (1, 3), for example. Thereby, the control grid 27 of the pixel 36 concerned has received beam irradiation of a desired irradiation time.

The XY stage 105 moves two beam pitches in the −x direction during the time from t=2Ttr to t=3Ttr, for example. During this time period, the tracking operation is continuously performed by the main deflector 208. When the time becomes t=3Ttr, the target control grid 27 to be written is shifted from the control grid 27 of the third pixel 36 from the right in the first row from the bottom of another sub-irradiation region 29 adjacent in the −x direction to the sub-irradiation region 29 concerned to the control grid 27 of the third pixel 36 from the right in the third row from the bottom of yet another sub-irradiation region 29 diagonally adjacent in the −x and y directions to the sub-irradiation region 29 concerned by collectively deflecting the multiple beams by the sub deflector 209. Since the XY stage 105 is moving also during this time period, the tracking operation by the main deflector 208 is continuously performed.

Then, as shown in FIG. 9D, during the time from t=3Ttr to t=4Ttr, the control grid 27 of the third pixel 36 from the right in the third row from the bottom of the sub-irradiation region 29 diagonally adjacent in the −x and y directions to the sub-irradiation region 29 concerned is irradiated with the fourth shot of the beam (1) at the coordinates (1, 3), for example. Thereby, the control grid 27 of the pixel 36 concerned has received beam irradiation of a desired irradiation time.

The XY stage 105 moves two beam pitches in the −x direction during the time from t=3Ttr to t=4Ttr, for example. During this time period, the tracking operation by the main deflector 208 is continuously performed. Thus, in this manner, writing of the total four pixels has been completed, namely, the first pixel from the right in the bottom row of the sub-irradiation region 29 concerned, the first pixel from the right in the third row from the bottom of the sub-irradiation region 29 adjacent in the y direction to the sub-irradiation region 29 concerned, the third pixel from the right in the first row from the bottom of the sub-irradiation region 29 adjacent in the −x direction to the sub-irradiation region 29 concerned, and the third pixel from the right in the third row from the bottom of the sub-irradiation region 29 diagonally adjacent in the −x and +y directions to the sub-irradiation region 29 concerned.

Thus, according to the first embodiment, the sub deflection position of the multiple beams 20 is shifted so that the number of shots per beam in each sub-irradiation region 29 may be the same as each other among the straddled sub-irradiation regions 29. In the example of FIGS. 9A to 9D, the sub deflection position of the multiple beams 20 is shifted so that the number of shots of the beam (1) in each of the adjacent four sub-irradiation regions 29 straddled by the beam (1) may be one each.

As shown in FIG. 9E, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 9E, when the time becomes t=4Ttr, tracking of the sub-irradiation region 29 concerned is cancelled, and the beam is swung back to a new sub-irradiation region 29 which has been shifted by eight beam pitches in the x direction. Although the beam (1) at the coordinates (1, 3) has been described in the example of FIGS. 9A to 9E, writing is also similarly performed for each sub-irradiation region 29 corresponding to a beam at other coordinates. That is, when the time becomes t=4Ttr, the beam at coordinates (n, m) completes writing of the total four pixels, namely, the first pixel from the right in the bottom row of a corresponding sub-irradiation region 29, the first pixel from the right in the third row from the bottom of the sub-irradiation region 29 adjacent in the y direction to the corresponding sub-irradiation region 29, the third pixel from the right in the first row from the bottom of the sub-irradiation region 29 adjacent in the −x direction to the corresponding sub-irradiation region 29 and the third pixel from the right in the third row from the bottom of the sub-irradiation region 29 diagonally adjacent in the −x and +y directions to the corresponding sub-irradiation region 29. For example, as described below, the beam (2) at coordinates (2, 3) completes writing of the total four pixels, namely, the first pixel from the right in the first row from the bottom of the sub-irradiation region 29 adjacent in the −x direction to the sub-irradiation region 29 concerned for the beam (1) shown in FIG. 9A, the first pixel from the right in the third row from the bottom of the sub-irradiation region 29 diagonally adjacent in the −x and +y directions to the sub-irradiation region 29 concerned for the beam (1) shown in FIG. 9B, the first pixel from the right in the third row from the bottom of the sub-irradiation region 29 next but one in the −x direction to the sub-irradiation region 29 concerned for the beam (1) shown in FIG. 9C, and the third pixel from the right in the third row from the bottom of the sub-irradiation region 29, next but one in the −x direction and in the next row in the y direction of the sub-irradiation region 29 concerned for the beam (1) shown in FIG. 9D.

According to the first embodiment, in the next tracking cycle after resetting the tracking, the sub deflector 209 performs deflection so that the writing position of each corresponding beam may be adjusted (shifted) to the control grid 27 of a pixel in which nothing has been written. For example, the writing position of each corresponding beam is adjusted (shifted) to the control grid 27 of the second pixel from the right in the bottom row of each sub-irradiation region 29.

As described above, in the state where the relative position of the irradiation region 34 to the target object 101 is controlled by the main deflector 208 to be an unchanged position during the same tracking cycle, each shot is performed while the sub deflector 209 performs shifting to straddle the sub-irradiation regions 29. Then, after finishing one tracking cycle and returning the tracking position of the irradiation region 34, as shown in FIG. 9E, the first shot position is adjusted to the position shifted by one control grid (one pixel), for example, and each shot is performed shifting so as to straddle the sub-irradiation regions 29 by the sub deflector 209 while a next tracking control is performed. By repeating this operation during writing the stripe region 32, the position of the irradiation region 34 is shifted one by one, such as from 34a to 34o, to perform writing of the stripe region concerned.

By executing the writing method described above, writing is performed for each n" control grids (n" pixels) in each sub-irradiation region 29 of n×n pixels by one tracking operation. This content point is the same as the case of the comparative example of FIG. 8. All the pixels in the sub-irradiation region 29 of n×n pixels are written by n' tracking operations. Also, with respect to other regions each composed of n×n pixels in the irradiation region of multiple beams, the same operation is executed at the same time to perform similar writing.

Figure 10A:
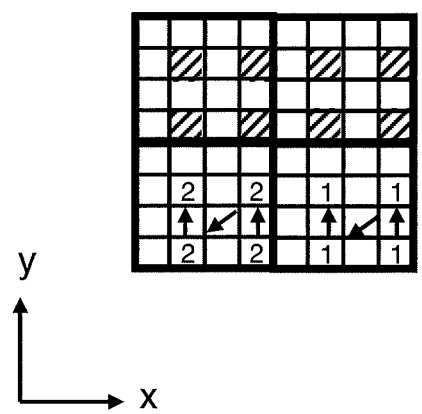
FIGS. 10A and 10B illustrate examples of a writing position according to the first embodiment and a comparative example.
Figure 10B:
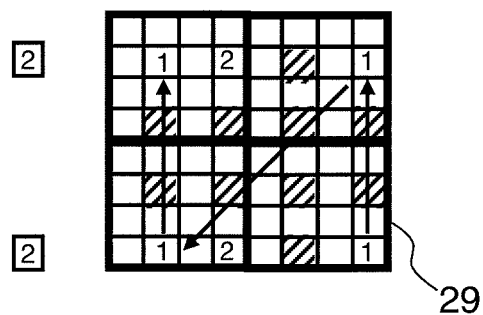

FIGS. 10A and 10B illustrate examples of a writing position according to the first embodiment and a comparative example. In a comparative example, as shown in FIG. 10A, when the writing method of the comparative example described with reference to FIG. 8 is executed, the sub-irradiation region 29 of 4×4 (=16) pixels is written by four different beams which have passed through different holes 22 in the shaping aperture array substrates 203. Then, writing is performed for each four pixels in each sub-irradiation region 29 by one beam which has passed through the same hole 22 in the shaping aperture array substrates 203. Therefore, if the one beam concerned has poor accuracy or is a defective beam, ¼ of the sub-irradiation region 29 concerned includes writing error. On the other hand, as shown in FIG. 10B, when the writing method of the first embodiment described with reference to FIGS. 9A to 9E is executed, the sub-irradiation region 29 of 4×4 pixels is written by sixteen different beams which have passed through different holes 22 in the shaping aperture array substrates 203. Then, writing is performed for one pixel by one pixel in each sub-irradiation region 29 by one beam which has passed through the same hole 22 in the shaping aperture array substrate 203. Therefore, when the one beam concerned has poor accuracy or is a defective beam, the region including writing error in the sub-irradiation region 29 concerned can be reduced to ¹⁄₁₆.

As described above, according to the first embodiment, since n' tracking cycles are performed to write the whole of the sub-irradiation region 29 composed of n×n pixels, the sub-irradiation region 29 of n×n pixels is written by n'×n" (n'×n"=n×n) different beams which have passed through different holes 22 in the shaping aperture array substrates 203. Specifically, writing is performed for one pixel by one pixel by one of the n'×n" different beams which has passed through the same hole 22 in the shaping aperture array substrates 203. Therefore, if the one beam concerned has poor accuracy or is a defective beam, the region including writing error in the sub-irradiation region 29 concerned can be reduced to 1/(n×n). Since no change occurs in the point that n' tracking cycles each composed of n" shots of the multiple beams 20 are performed in order to write the whole of the sub-irradiation region 29 of n×n pixels, it is possible to avoid increasing the number of occurrences of the settling time and control idling time, needed for each tracking cycle, of DAC amplifier for main deflector 208. Therefore, throughput degradation can be avoided.

Figure 11:
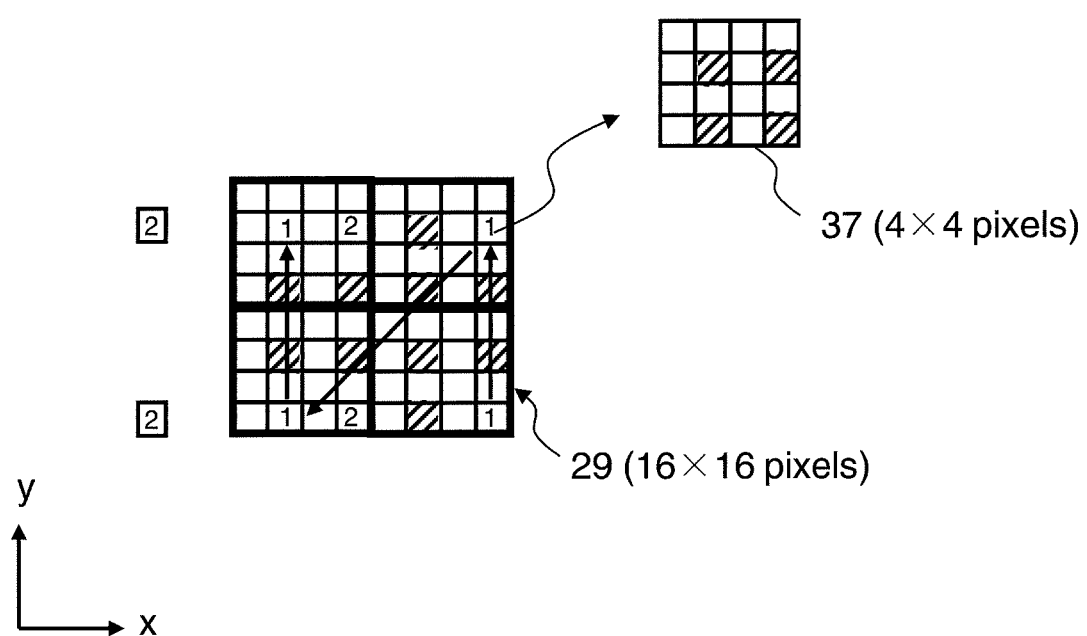
FIG. 11 illustrates an example of a writing position according to a modified example of the first embodiment.

FIG. 11 illustrates an example of a writing position according to a modified example of the first embodiment. Although the case of the sub-irradiation region 29 composed of 4×4(=16) pixels has been described above, it is not limited thereto. In the example of FIG. 11, the sub-irradiation region 29 in the shape of a rectangle and whose side is a pitch between beams is composed of 16×16 (=256) pixels. For example, the case where the whole (256 pixels) of the sub-irradiation region 29 is written by repeating sixteen tracking cycles each composed of sixteen shots is described below. When the beam moves among the sub-irradiation regions 29 at each tracking cycle, the whole (256 pixels) of the sub-irradiation region 29 of 16×16 pixels is written with sixteen different beams through sixteen tracking cycles, where one beam performs writing by each sixteen shots in one sub-irradiation region 29. Then, if the one beam concerned has poor accuracy or is a defective beam, ¹⁄₁₆ of the sub-irradiation region 29 concerned includes writing error. Therefore, in the modified example of the first embodiment, the number of different beams to perform writing in the sub-irradiation region 29 is increased. Here, it is possible to assume that one beam writes sixteen (=4×4) sub-irradiation regions 29 by performing one shot by one shot during one tracking cycle of sixteen shots, using the sub deflector 209 with a deflection swing width capable of deflecting four inter-beam pitches in each of the x and y directions, for example. However, in such a case, the settling time of the DAC amplifier for the sub deflector 209, occurring at each shifting, becomes long in proportion as the deflection swing width increases, thereby leading to decrease of throughput.

Then, in the modified example of the first embodiment, not performing shifting at each shot by each beam so as to straddle the sub-irradiation regions 29, but shifting is performed to other sub-irradiation region 29 after a plurality of shots of each beam have completed in one sub-irradiation regions 29. In that case, when each beam performs a plurality of beam shots in the corresponding sub-irradiation region 29, the sub deflection position of the multiple beams is shifted at each shot to a different position in the sub-irradiation region 29. In the case of FIG. 11, every time four different pixels in each pixel group 37 (for example, 4×4 (=16) pixels) being one unit in the sub-irradiation region 29 (for example, 16×16(=256) pixels) are written by one beam for the pixel group 37 by performing a predetermined number of shots (four times) of the multiple beams 20 while applying the shot to every other pixel, shifting is performed to shift to the sub-irradiation region 29 adjacent in the y direction to the sub-irradiation region 29 concerned (target sub-irradiation region 29), to the sub-irradiation region 29 adjacent in the −x direction to the sub-irradiation region 29 concerned, and to the sub-irradiation region 29 diagonally adjacent in the −x and +y directions to the sub-irradiation region 29 concerned. Moreover, in that case, the sub deflection position of the multiple beams 20 is shifted so that the irradiation position of each beam in the sub-irradiation region 29 may be different from each other among the straddled sub-irradiation regions 29, and so that the number of shots (e.g., four times) of the beam concerned in each sub-irradiation region 29 may be the same as each other among the straddled sub-irradiation regions 29. With this method, only by making the sub deflector 209 have a deflection swing width capable of deflecting two inter-beam pitches in each of the x and y directions, the number of pixels in the sub-irradiation region 29 to be written by one beam which has passed through the same hole 22 in the shaping aperture array substrate 203 can be reduced to ¹⁄₆₄. Thus, in the modified example of the first embodiment, since the whole of the sub-irradiation region 29 of 16×16 pixels is written with sixty-four different beams through sixteen tracking cycles, where one beam performs writing by each four shots, it is possible to reduce the region including writing error in the sub-irradiation region 29 concerned to ¹⁄₆₄ while inhibiting increase in settling time.

When writing the target object 101 with the multiple beams 20, as described above, during the tracking operation by the deflector 208, while following the movement of the XY stage 105, irradiation of the multiple beams 20 serving as shot beams is performed up to a required number in the sub-irradiation region 29 while straddling the sub-irradiation regions 29 by shifting the beam deflection position by the sub deflector 209. It is determined, based on the writing sequence, which beam of the multiple beams irradiates which control grid 27 (pixel 36) on the target object 101.

In the examples described above, during one tracking operation, while the irradiation position of one beam straddles the sub-irradiation regions 29, the corresponding pixel (or pixel group 37 being one unit) in each sub-irradiation region 29 is shifted to every other pixel so as to perform writing in n control grids (n pixels). However, the method is not limited thereto.

Figure 12:
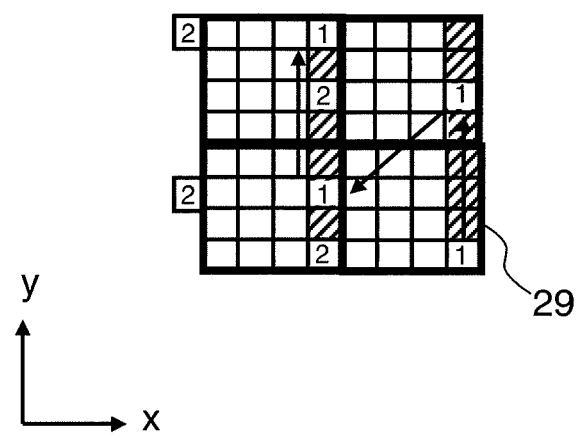
FIG. 12 illustrates another example of a writing position according to a modified example of the first embodiment.

FIG. 12 illustrates another example of a writing position according to a modified example of the first embodiment. In the case of FIG. 12, every time the irradiation position of one beam straddles the sub-irradiation regions 29, the corresponding pixel (or pixel group 37 being one unit) in each sub-irradiation region 29 is shifted in the y direction one pixel by one pixel so as to perform writing in n control grids (n pixels). Also, with respect to other regions each composed of n×n pixels in the irradiation region of the multiple beams, the same operation is executed at the same time to perform similar writing. Alternatively, every time the irradiation position of one beam straddles the sub-irradiation regions 29, the corresponding pixel (or pixel group 37 being one unit) in each sub-irradiation region 29 may be shifted in the −x direction or diagonal direction one pixel by one pixel so as to perform writing in n control grids (n pixels).

Now, operations of actual writing processing using the writing data having been input from the outside of the writing apparatus 100 and stored in the storage device 140 is described below step by step.

In the area ratio map generation step (rasterizing step), the rasterizing unit 50 reads writing data from the storage device 140, and calculates, for each pixel 36, a pattern area density ρ' in the pixel 36 concerned. This processing is performed for each stripe region 32, for example.

In the dose calculation step, the dose calculation unit 52 virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 μm. The dose calculation unit 52 reads writing data from the storage device 140, and calculates, for each proximity mesh region, a pattern area density ρ of a pattern arranged in the proximity mesh region concerned.

Next, the dose calculation unit 52 calculates, for each proximity mesh region, a proximity-effect correction irradiation coefficient $D_p(x)$ (correction dose) for correcting a proximity effect. An unknown proximity-effect correction irradiation coefficient $D_p(x)$ can be defined by a threshold value model for proximity-effect correction, which is the same as the one used in a conventional method, where a backscatter coefficient η, a dose threshold value Dth of a threshold value model, a pattern area density ρ, and a distribution function g(x) are used.

Next, the dose calculation unit 52 calculates, for each pixel 36, an incident dose $D(x)$ (dose amount) with which the pixel 36 concerned is irradiated. The incident dose $D(x)$ can be calculated, for example, by multiplying a pre-set base dose $D_{base}$, a proximity effect correction irradiation coefficient $D_p$, and a pattern area density ρ'. The base dose $D_{base}$ can be defined by Dth/(½+η), for example. Thereby, it is possible to obtain an originally desired incident dose $D(x)$, for which the proximity effect has been corrected, based on layout of a plurality of figure patterns defined by the writing data.

The dose calculation unit 52 generates an irradiation time data map (1) in which the irradiation time for each pixel 36 is defined by way of converting an incident dose $D(x)$ for each pixel 36 into an irradiation time t by gradation using gray scale levels based on a predetermined quantization unit A. The generated irradiation time data map (1) is stored in the storage device 142, for example.

In the irradiation time data processing step, the irradiation time data processing unit 54 reads the irradiation time data map (1), and rearranges it in order of shot in accordance with the writing sequence according to the first embodiment. Then, the irradiation time data processing unit 54 transmits the irradiation time t data to the deflection control circuit 130 in order of shot.

In the writing step, the deflection control circuit 130 outputs a blanking control signal to the blanking aperture array mechanism 204 in order of shot, and a deflection control signal to the DAC amplifier units 132 and 134 in order of shot. Using the multiple beams 20, the writing mechanism 150 writes a figure pattern on the target object 101 while the tracking control described above is performed and the sub-irradiation regions 29 each under the tracking control are straddled by the multiple beams being shifted.

In the examples described above, the deflection swing width of the sub deflector 209 is two inter-beam pitches, but it is not limited thereto. It is sufficient that the straddling by the shifted multiple beams is performed in the range not increasing, or not largely increasing, the settling time of the sub deflector 209 whose deflection swing width is rather smaller than that of the main deflector 208. By suppressing the shift amount of the multiple beams straddling the sub-irradiation regions 29 not to be large, influence of position-dependent distortion of the multiple beams formed by the shaping aperture array substrate 203 can be avoided.

As described above, according to the first embodiment, the number of different beams to write each sub-irradiation region 29 (inter-beam pitch region) can be increased while suppressing throughput decrease in multi-beam writing. Therefore, writing error resulting from accuracy difference among respective beams can be averaged.

Second Embodiment

In the first embodiment, multiple beams are shifted so as to straddle the sub-irradiation regions 29 by the sub deflector 209, but it is not limited thereto. According to a second embodiment, multiple beams are shifted so as to straddle the sub-irradiation regions 29 by the main deflector 208. The structure of the writing apparatus 100 in the second embodiment is the same as that of FIG. 1. The contents of the present embodiment are the same as those of the first embodiment except for what is specifically described below.

Figure 13A:
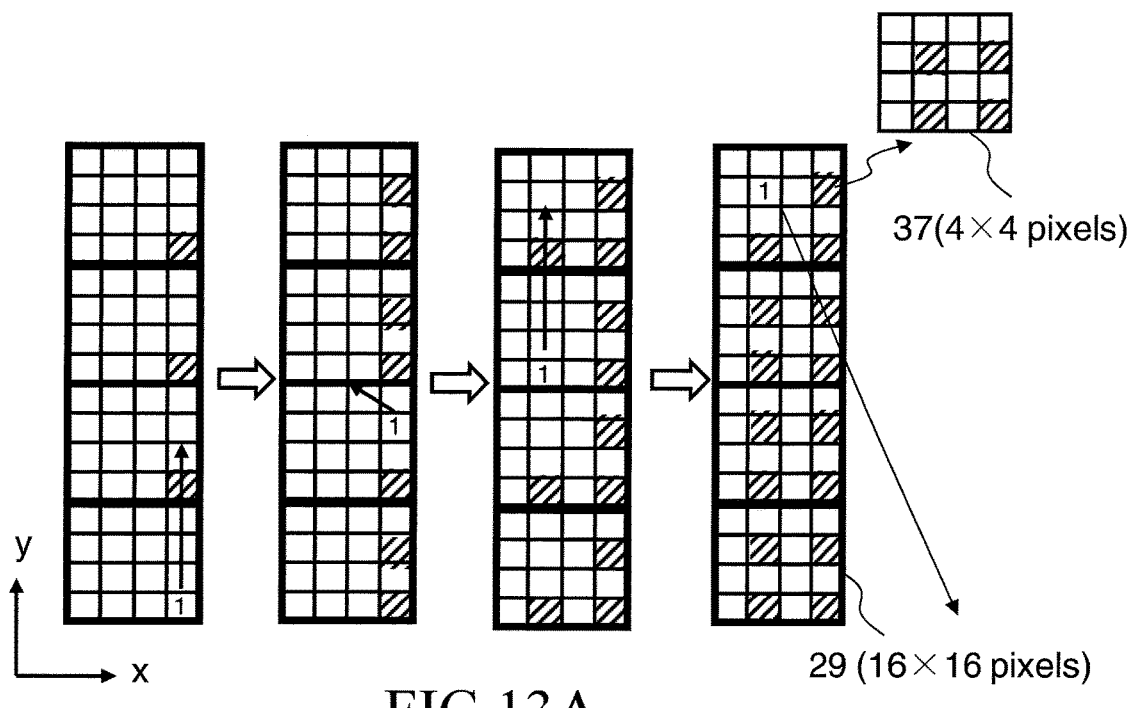
FIGS. 13A to 13C illustrate an example of a writing position according to a second embodiment.
Figure 13B:
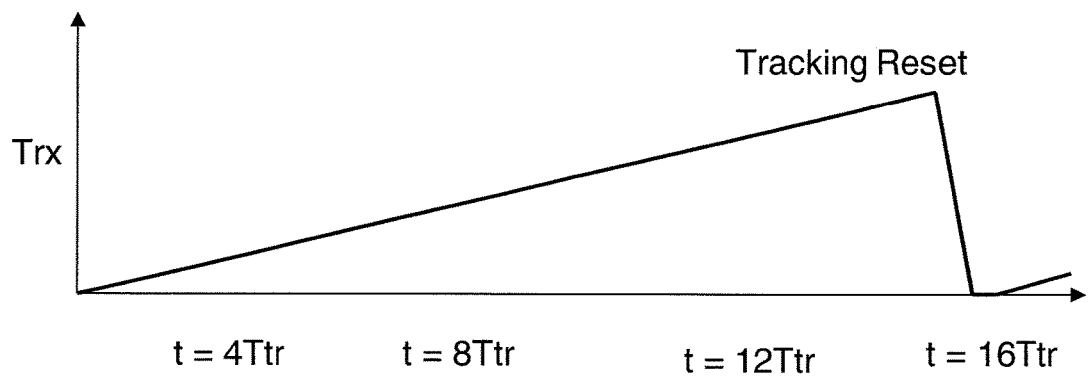
Figure 13C:
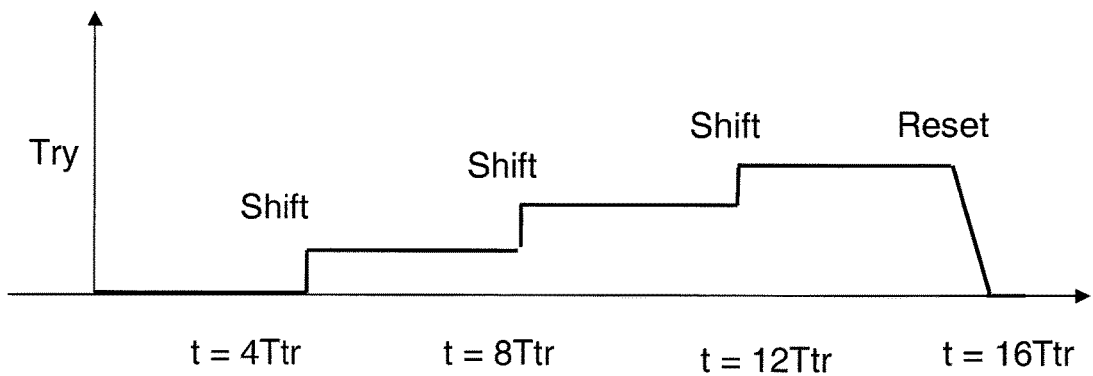

FIGS. 13A to 13C illustrate an example of a writing position according to the second embodiment. As described above, in the case of using the sub deflector 209 with a deflection swing width capable of deflecting two inter-beam pitches in each of the x and y directions, for example, it is possible to shift to the adjacent sub-irradiation region 29, but shifting to beyond the adjacent one is difficult. Therefore, increasing the number of different beams to write each sub-irradiation region 29 (inter-beam pitch region) is restricted by the deflection swing width of the sub deflector 209. Furthermore, for shifting a long distance, it is necessary to exchange the sub deflector 209 and the DAC amplifier unit 132 to ones with a long deflection swing width. By contrast, although the main deflector 208 with a large deflection swing width is used for beam deflection in a tracking direction (e.g., x direction), it is not used for the y direction orthogonal to the x direction. With respect to the y direction, the main deflector 208 can also perform beam deflection of the distance equivalent to the tracking deflection amount. Then, according to the second embodiment, using the deflector for tracking control (main deflector 208), multiple beams are shifted in the direction orthogonal to the tracking direction during a tracking control.

In the case of FIG. 13A, every time four different pixels in the pixel group 37 (for example, 4×4(=16) pixels) being one unit in the sub-irradiation region 29 are written using one beam by four shots of the multiple beams 20 while applying the shot to every other pixel by the sub deflector 209, shifting is performed by the main deflector 208 to shift to the sub-irradiation region 29 adjacent in the y direction to the sub-irradiation region 29 concerned (target sub-irradiation region 29), to the sub-irradiation region 29 next but one in the y direction to the sub-irradiation region 29 concerned, and to the sub-irradiation region 29 next but two in the y direction to the sub-irradiation region 29 concerned. FIG. 13B shows a tracking deflection amount Trx in the x direction of the main deflector 208. FIG. 13C shows a tracking deflection amount Try in the y direction of the main deflector 208. Moreover, in that case, the sub deflection position of the multiple beams 20 is shifted so that the irradiation position of each beam in the sub-irradiation region 29 may be different from each other among the straddled sub-irradiation regions 29, and so that the number of shots (e.g., four times) of the beam concerned in each sub-irradiation region 29 may be the same as each other among the straddled sub-irradiation regions 29. With this method, intactly using the sub deflector 209 with a deflection swing width capable of deflecting two inter-beam pitches in each of the x and y directions, the number of pixels in the sub-irradiation region 29 to be written by one beam which has passed through the same hole 22 in the shaping aperture array substrate 203 can be reduced to 1/64. Since the deflection swing width in the y direction of the main deflector 208 is still large enough, the number of times of straddling in the y direction the sub-irradiation regions 29 can be increased by reducing the number of shots of the pixel group 37 serving as one unit. For example, every time two different pixels in a pixel group 37 (for example, 4×4(=16) pixels) being one unit in the sub-irradiation region 29 are written using one beam by two shots of the multiple beams 20 while shifting the multiple beams 20 by the sub deflector 209, shifting may be performed by the main deflector 208 to shift to the sub-irradiation region 29 adjacent in the y direction to the sub-irradiation region 29 concerned, to the sub-irradiation region 29 next but one in the y direction to the sub-irradiation region 29 concerned, to the sub-irradiation region 29 next but two in the y direction to the sub-irradiation region 29 concerned, to the sub-irradiation region 29 next but three in the y direction to the sub-irradiation region 29 concerned, to the sub-irradiation region 29 next but four in the y direction to the sub-irradiation region 29 concerned, to the sub-irradiation region 29 next but five in the y direction to the sub-irradiation region 29 concerned, and to the sub-irradiation region 29 next but six in the y direction to the sub-irradiation region 29 concerned. With this method, intactly using the sub deflector 209 with a deflection swing width capable of deflecting two inter-beam pitches in each of the x and y directions, the number of pixels in the sub-irradiation region 29 to be written by one beam which has passed through the same hole 22 in the shaping aperture array substrate 203 can be reduced to 1/128.

Figure 14:
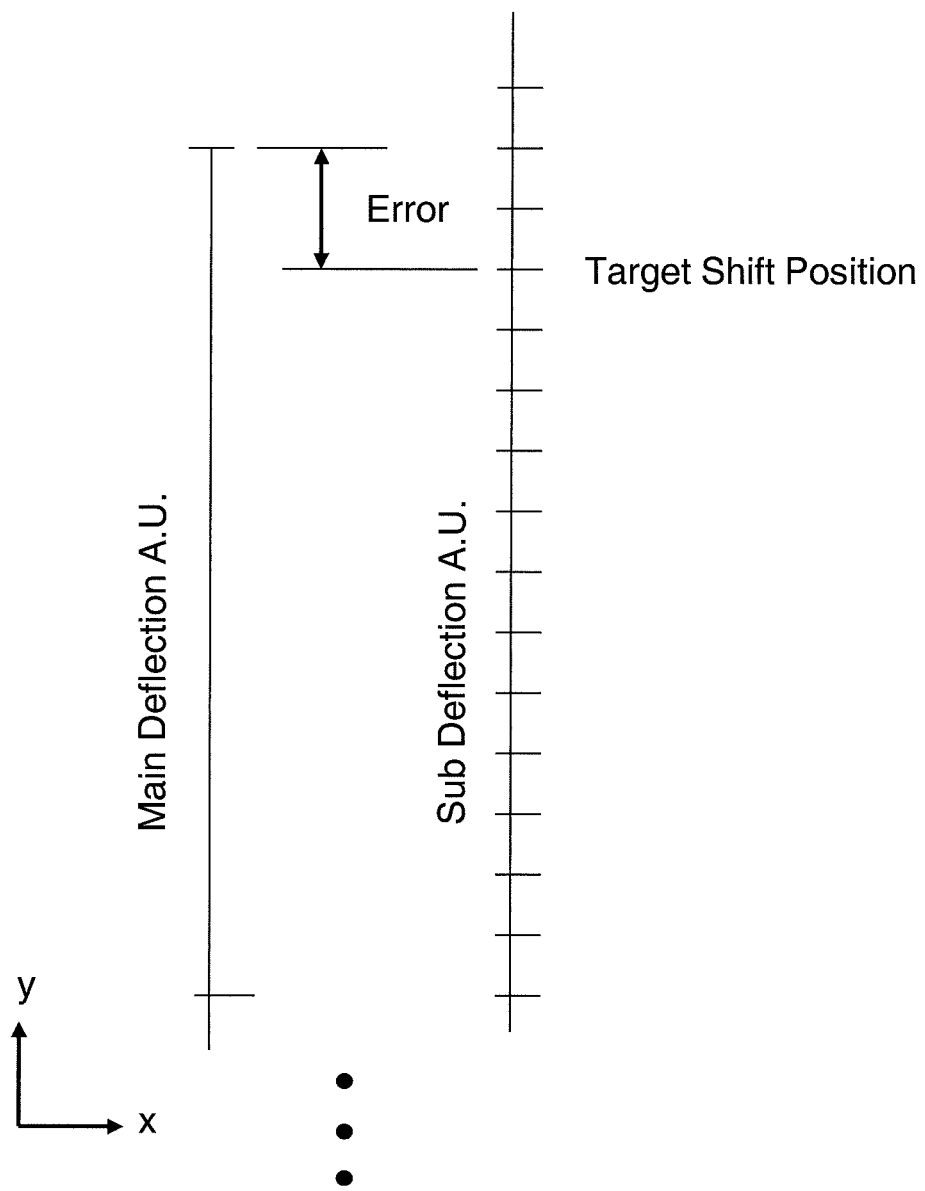
FIG. 14 illustrates a correction method of a beam deflection position according to the second embodiment.

FIG. 14 illustrates a correction method of a beam deflection position according to the second embodiment. The deflection swing width of the main deflector 208 is sufficiently larger than that of the sub deflector 209. Therefore, the resolution of the control grid of the main deflector 208 is coarser than that of the sub deflector 209. In other words, the control address unit (A. U.) of the main deflector 208 is larger than that of the sub deflector 209. Therefore, when beam shift is performed in the y direction by the main deflector 208, resolution error may occur in the deflection position. Then, according to the second embodiment, when the beam shift is performed in the y direction by the main deflector 208, if the deflection position after shifting deviates from the target shift position, correction is carried out by the sub deflector 209. Thereby, the beam shift can be performed with great accuracy.

Here, every time the main deflector 208 shifts multiple beams in the y direction, the settling time of the main deflector 208 becomes needed. However, if the shift amount for shifting multiple beams in the y direction is made small to the tracking deflection amount, the y-direction settling time of the main deflector 208 can be shorter than the settling time at tracking reset. Thus, influence on the throughput can be small compared to the case where the number of shiftings among the sub-irradiation regions 29 is increased by increasing the number of tracking cycles.

As described above, according to the second embodiment, the number of different beams to write each sub-irradiation region 29 (inter-beam pitch region) can be increased while suppressing throughput decrease in multi-beam writing. Therefore, writing error resulting from accuracy difference among respective beams can be averaged.

As a modified example of the second embodiment, it is also preferable to combine the shifting in the y direction by the main deflector 208 and the shifting in the x and/or y direction (s) by the sub deflector 209 in order to execute the shifting among the sub-irradiation regions 29 during one tracking cycle. By combining, multiple beams can be shifted to a position to which it is difficult to shift only by the sub deflector 209 while reducing the number of occurrences of y-direction settling time of the main deflector 208. Therefore, compared to the second embodiment described above, the number of different beams to write each sub-irradiation region 29 (inter-beam pitch region) can be increased while reducing the number of occurrences of y-direction settling time of the main deflector 208.

Embodiments have been explained referring to specific examples described above. However, the present invention is not limited to these specific examples. For example, although, in the example described above, shifting in the y direction by the main deflector 208 is performed every four shots, it is not limited thereto. Shifting in the y direction by the main deflector 208 may be performed for each shot. Although throughput is sacrificed, influence on the throughput can be reduced compared to the case where the number of tracking cycles is increased in order to increase the number of shiftings among the sub-irradiation regions 29.

While the case of inputting a 10-bit control signal into each control circuit 41 to be controlled has been described above, the number of bits may be suitably set. For example, a 2-bit (or any one of 3 to 9 bit) control signal may be used. Alternatively, a control signal of 11 bits or more may be used.

While the apparatus configuration, control method, and the like not directly necessary for explaining the present invention are not described, some or all of them can be selectively used case-by-case basis. For example, although description of the configuration of the control circuit for controlling the writing apparatus 100 is omitted, it should be understood that some or all of the configuration of the control circuit can be selected and used appropriately when necessary.

In addition, any other multiple charged particle beam writing apparatus and multiple charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple charged particle writing method comprising:
    performing a tracking operation by shifting a main deflection position of multiple beams using charged particle beams in a direction of movement of a stage so that the main deflection position of the multiple beams follows the movement of the stage while a predetermined number of beam shots of the multiple beams are performed; and shifting a sub deflection position of the multiple beams so that each beam of the multiple beams straddles rectangular regions in a plurality of rectangular regions during each tracking operation, and the each beam is applied to a different position in each of the rectangular regions straddled, and applying a predetermined number of shots per beam using a plurality of beams in the multiple beams to each of the plurality of rectangular regions during the each tracking operation, wherein the plurality of rectangular regions are a plurality of sub-irradiation regions obtained by dividing a writing region of a target object into meshes by a size of a pitch between beams of the multiple beams.

2. The method according to claim 1, wherein the performing the tracking operation is executed using a first deflector, and the shifting the sub deflection position is executed using a second deflector.

3. The method according to claim 1, wherein
the performing the tracking operation is executed using a first deflector, and the shifting the sub deflection position to straddle the rectangular regions is executed using the first deflector in a direction orthogonal to the direction of movement of the stage, and
the shifting the sub deflection position of the multiple beams in the each of the rectangular regions straddled is executed by using a second deflector.

4. The method according to claim 1, wherein the sub deflection position is shifted to the different position at each of the beam shots in the each of the rectangular regions straddled in the plurality of rectangular regions.

5. A multiple charged particle beam writing apparatus comprising:
a stage configured to be movable and to mount thereon a target object;
an emission source configured to emit a charged particle beam;
a shaping aperture array substrate, in which a plurality of openings are formed, configured to form and shape multiple beams by letting portions of the charged particle beam individually pass through a corresponding one of the plurality of openings;

a first deflector configured to perform a tracking operation by shifting a main deflection position of the multiple beams in a direction of movement of the stage so that the main deflection position of the multiple beams follows the movement of the stage;
a second deflector configured to shift a sub deflection position of the multiple beams during the tracking operation; and
a deflection control circuit configured to control the first deflector and the second deflector so that each beam of the multiple beams straddles rectangular regions in a plurality of rectangular regions during each tracking operation, and the each beam is applied to a different position in each of the rectangular regions straddled, and so that a predetermined number of shots per beam using a plurality of beams in the multiple beams are applied to each of the plurality of rectangular regions during the each tracking operation, wherein the plurality of rectangular regions are a plurality of sub-irradiation regions obtained by dividing a writing region of a target object into meshes by a size of a pitch between beams of the multiple beams.

6. The apparatus according to claim 5, wherein, during the each tracking operation, the second deflector shifts the sub deflection position of the multiple beams so as to straddle the rectangular regions in the plurality of rectangular regions.

7. The apparatus according to claim 6, wherein, during the each tracking operation, the second deflector shifts the sub deflection position of the multiple beams to an adjacent rectangular region in the plurality of rectangular regions.

8. The apparatus according to claim 7, wherein, during the each tracking operation, the second deflector shifts the sub deflection position of the multiple beams to rectangular regions adjacent in orthogonal two directions in the plurality of rectangular regions.

9. The apparatus according to claim 5, wherein, during the each tracking operation, the first deflector shifts the sub deflection position of the multiple beams so as to straddle the rectangular regions in the plurality of rectangular regions.

10. The apparatus according to claim 9, wherein, during the each tracking operation, the first deflector shifts the sub deflection position of the multiple beams in a direction orthogonal to the direction of movement of the stage so as to straddle the rectangular regions in the plurality of rectangular regions.

* * * * *